(12) United States Patent
Moniwa et al.

(10) Patent No.: US 6,964,832 B2
(45) Date of Patent: Nov. 15, 2005

(54) SEMICONDUCTOR DEVICE AND MANUFACTURING METHOD THEREOF

(75) Inventors: Akemi Moniwa, Sayama (JP); Jiro Yamamoto, Tachikawa (JP); Fumio Murai, Hinode (JP); Hiroshi Fukuda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 155 days.

(21) Appl. No.: 10/374,096

(22) Filed: Feb. 27, 2003

(65) Prior Publication Data

US 2003/0228758 A1    Dec. 11, 2003

(30) Foreign Application Priority Data

Jun. 6, 2002    (JP) ............................. 2002-165252

(51) Int. Cl.[7] ............................. G03F 9/00; G03C 5/00
(52) U.S. Cl. ......................... 430/30; 430/296; 430/942
(58) Field of Search ........................ 430/30, 296, 942

(56) References Cited

U.S. PATENT DOCUMENTS

| | | | |
|---|---|---|---|
| 6,117,600 A | * | 9/2000 | Nakasuji ..................... 430/30 |
| 6,586,341 B2 | | 7/2003 | Moniwa et al. |
| 6,709,880 B2 | | 3/2004 | Yamamoto |

FOREIGN PATENT DOCUMENTS

| | | |
|---|---|---|
| JP | 08-236428 | 3/1995 |
| JP | 11-204422 | 1/1998 |

OTHER PUBLICATIONS

Takeshi Yamaguchi, "EB Stepper—A High Throughput Electron-Beam Projection Lithography System", Japanese Journal Applied Physics, vol. 39(2000), pp. 6897-6901.

Kazuaki Suzuki, et al., "Nikon EB stepper: its system concept and countermeasures for critical issues," Proceedings of SPIE, vol. 3997 2000), pp. 214-224.

Hiroshi Yamashita, "Mask split algorithm for stencil mask in electron projection lithography", J. Vac. Sci. Technol. B 19(6), Nov./Dec. 2001, pp. 2478-2481.

\* cited by examiner

*Primary Examiner*—Christopher G. Young
(74) *Attorney, Agent, or Firm*—Reed Smith LLP; Stanley P. Fisher, Esq.; Juan Carlos A. Marquez, Esq.

(57) ABSTRACT

A method is provided for solving a problem that the fine processing property is degraded by an increase of a current applied to complementarily divided masks in an electron beam projection process. In the method, the complementarily divided masks used for electron projection are used whereby one mask is used for patterns requiring high dimensional accuracy and another is used for other patterns. Consequently, it is possible to lower the current applied to the patterns requiring high dimensional accuracy to realize high printing accuracy. In addition, the highly accurate patterns can be formed at a high throughput.

11 Claims, 22 Drawing Sheets

501

MASK A

502

MASK B

| 8 | 18 | 16 | (64) | 18 | 6 | ~CHIP |
|---|----|----|------|----|---|-------|
| 10 | (52) | (28) | (36) | (40) | 10 | |
| 12 | 18 | (68) | 18 | 12 | 12 | |
| 12 | (48) | (48) | (38) | 12 | 10 | |
| 10 | (48) | 16 | (50) | 12 | 8 | |
| 8 | (44) | (42) | (60) | (28) | 6 | |

FIG. 6B-1

MASK A

| 4 | 9 | 8 | (32) | 9 | 3 |
|---|---|---|------|---|---|
| 5 | (26) | 14 | 18 | (20) | 5 |
| 6 | 9 | (34) | 9 | 6 | 6 |
| 6 | (24) | (24) | 19 | 6 | 5 |
| 5 | (24) | 8 | (25) | 6 | 4 |
| 4 | (22) | (21) | (30) | 14 | 3 |

MASK B

| 4 | 9 | 8 | (32) | 9 | 3 |
|---|---|---|------|---|---|
| 5 | (26) | 14 | 18 | (20) | 5 |
| 6 | 9 | (34) | 9 | 6 | 6 |
| 6 | (24) | (24) | 19 | 6 | 5 |
| 5 | (24) | 8 | (25) | 6 | 4 |
| 4 | (22) | (21) | (30) | 14 | 3 |

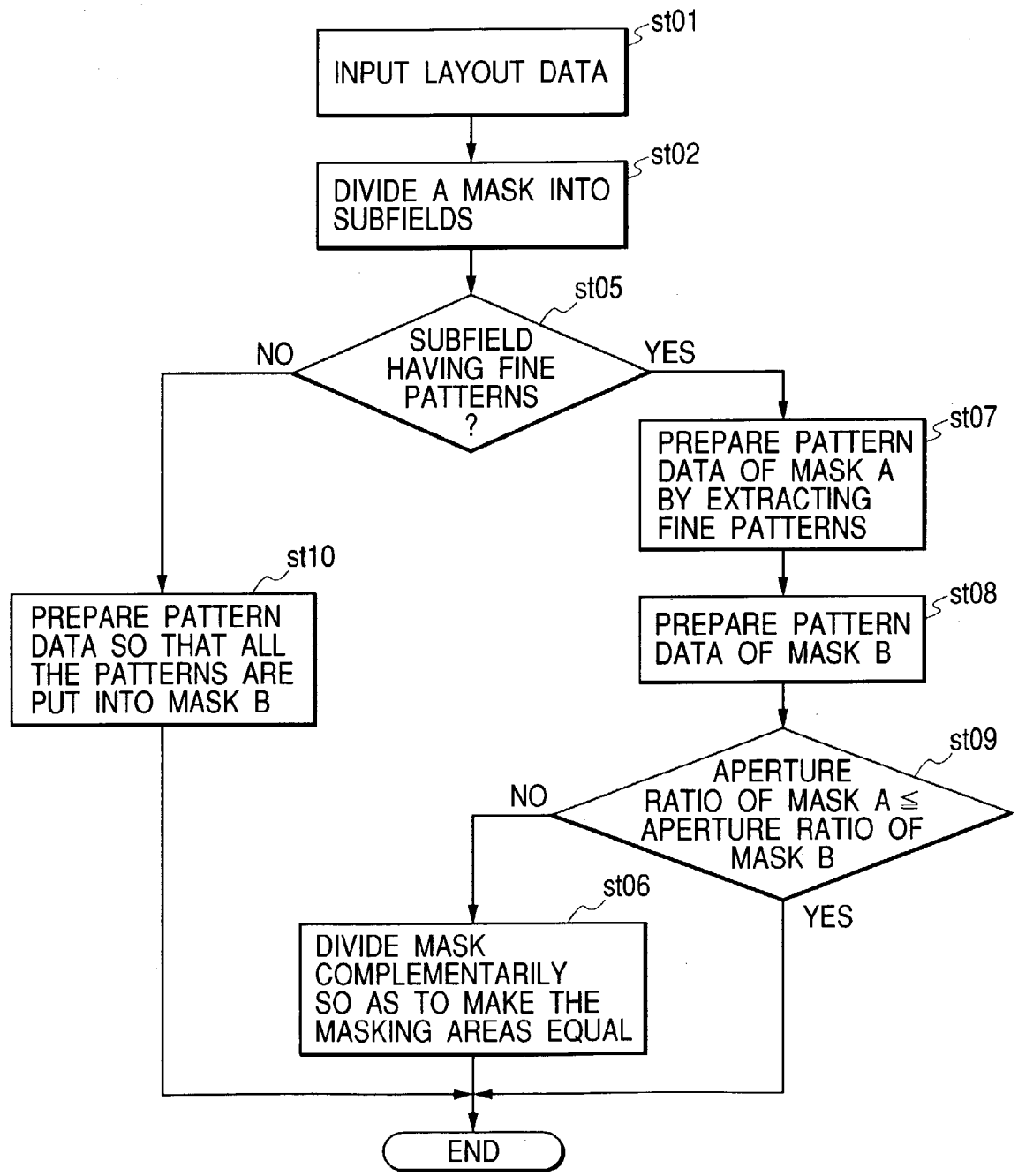

FIG. 16A

|   |   |   |   |   |   |
|---|---|---|---|---|---|
| 8 | 18 | 16 | (64) | 18 | 6 |
| 10 | (52) | (28) | (36) | (40) | 10 |
| 12 | 18 | (68) | 18 | 12 | 12 |
| 12 | (48) | (48) | (38) | 12 | 10 |
| 10 | (48) | 16 | (50) | 12 | 8 |
| 8 | (44) | (42) | (60) | (28) | 6 |

FIG. 16B-1

MASK A

|   |   |   |   |   |   |
|---|---|---|---|---|---|
| 4 | 9 | 8 | (32) | 9 | 3 |
| 5 | 10 | 14 | 15 | 15 | 5 |
| 6 | 9 | 10 | 9 | 6 | 6 |
| 6 | 19 | 13 | 15 | 6 | 5 |
| 5 | (24) | 8 | 10 | 16 | 4 |
| 4 | 13 | 11 | 9 | 13 | 3 |

FIG. 16B-2

MASK B

|   |   |   |   |   |   |
|---|---|---|---|---|---|
| 4 | 9 | 8 | (32) | 9 | 3 |
| 5 | (42) | 14 | 18 | (25) | 5 |
| 6 | 9 | (58) | 9 | 6 | 6 |
| 6 | (29) | (35) | (23) | 6 | 5 |
| 5 | (24) | 8 | (40) | 6 | 4 |
| 4 | (31) | (31) | (51) | 15 | 3 |

FIG. 16C-1

|   |   |   |   |   |   |
|---|---|---|---|---|---|
| 4 | 9 | 8 | (32) | 9 | 3 |
| 5 | (26) | 14 | 18 | (20) | 5 |
| 6 | 9 | (34) | 9 | 6 | 6 |
| 6 | (24) | (24) | 19 | 6 | 5 |
| 5 | (24) | 8 | (25) | 6 | 4 |
| 4 | (22) | (21) | (30) | 14 | 3 |

FIG. 16C-2

|   |   |   |   |   |   |
|---|---|---|---|---|---|
| 4 | 9 | 8 | (32) | 9 | 3 |
| 5 | (26) | 14 | 18 | (20) | 5 |
| 6 | 9 | (34) | 9 | 6 | 6 |
| 6 | (24) | (24) | 19 | 6 | 5 |
| 5 | (24) | 8 | (25) | 6 | 4 |
| 4 | (22) | (21) | (30) | 14 | 3 |

FIG. 18B-1
MASK A

FIG. 18B-2
MASK B

FIG. 18C-1
MASK A

FIG. 18C-2
MASK B

FIG. 20A

| 1-1 | 1-2 | 1-3 | 1-4 | 1-5 |
|---|---|---|---|---|
| 2-1 | 2-2 | 2-3 | 2-4 | 2-5 |
| 3-1 | 3-2 | 3-3 | 3-4 | 3-5 |
| 4-1 | 4-2 | 4-3 | 4-4 | 4-5 |
| 5-1 | 5-2 | 5-3 | 5-4 | 5-5 |
| 6-1 | 6-2 | 6-3 | 6-4 | 6-5 |

CHIP

FIG. 20B-1

| A1-1 | A1-2 | A1-3 | A1-4 | A1-5 |
|---|---|---|---|---|
| A2-1 | A2-2 | A2-3 | A2-4 | A2-5 |
| A3-1 | A3-2 | A3-3 | A3-4 | A3-5 |
| A4-1 | A4-2 | A4-3 | A4-4 | A4-5 |
| A5-1 | A5-2 | A5-3 | A5-4 | A5-5 |
| A6-1 | A6-2 | A6-3 | A6-4 | A6-5 |

MASK A

FIG. 20B-2

| B1-1 | B1-2 | B1-3 | B1-4 | B1-5 |
|---|---|---|---|---|
| B2-1 | B2-2 | B2-3 | B2-4 | B2-5 |
| B3-1 | B3-2 | B3-3 | B3-4 | B3-5 |
| B4-1 | B4-2 | B4-3 | B4-4 | B4-5 |
| B5-1 | B5-2 | B5-3 | B5-4 | B5-5 |
| B6-1 | B6-2 | B6-3 | B6-4 | B6-5 |

MASK B

SEMICONDUCTOR DEVICE AND MANUFACTURING METHOD THEREOF

BACKGROUND OF THE INVENTION (1) Field of the Invention

The present invention relates to a method for manufacturing semiconductor devices used for semiconductor integrated circuits, liquid crystal panels, etc. More particularly, the present invention relates to a method for manufacturing semiconductor devices with use of an electron beam projection method that is a lithographic technique employed for forming fine patterns of the semiconductor devices, as well as a method for forming the masks used by the method and a method for generating data for the masks.

(2) Description of the Related Art

Lithographic techniques are usually employed for forming patterns of semiconductor integrated circuits, etc. And, a light, an electron beam, or the like is used as the energy beam. The photo-lithography among those lithographic techniques has been improved in resolution by changing the wavelength of the light source from a g-line (436 nm) to such short wavelengths as an i-line (365 nm) and a KrF (248 nm). However, performance of such the photo-lithography is now coming to become too insufficient to satisfy a pattern dimension required as device performance. The wavelengths of light sources are thus further required to become shorter to improve the resolution ability. To meet such the requirement, however, a huge amount of development cost is needed to develop not only the light source but also lens glass materials and resists. The equipment and process costs also rise, which will then result in significant rising of the costs of the semiconductor devices manufactured with use of those lenses and resists.

On the other hand, the electron beam lithography is higher in resolution than the photo-lithography while the conventional electron beam lithographic equipment have not been suited for mass production of semiconductor devices because of the throughput, since each of them applies a point beam all over the target resist completely or scans patterns having a size of several micrometers ($\mu$m) square or so, which are connected to one after another.

One of the methods proposed for improving this electron beam lithography throughput is disclosed, for example, in "Japanese Journal Applied Physics, vol. 39 (2000)), pp. 6897 to 6901". According to the method, all the patterns formed on the entire surface of a target chip are generated as an original mask (hereinafter, to be referred to as a mask) and an electron beam is irradiated to this mask to project/print those patterns on the wafer. The method is referred to as the Electron Projection Lithography. This method is similar to the photo-lithography in the aspect of the projection of a beam. The method differs from the photo-lithography only in that the light source is changed to an electron beam, although the throughput is improved by one figure to 35 (8-inch wafers)/hour from the conventional electron beam lithography.

The shape of this electron beam printing mask is shown, for example, in "Proceedings of SPIE, vol. 3997 (2000), pp. 214 to 224". FIG. 2A shows a bird's eye view of the electron beam printing mask, FIG. 2B shows an expanded view of the mask shown in FIG. 2A, and FIG. 2C shows a top view of the mask. According to the electron projection lithography, a circuit pattern of an LSI chip is divided into a plurality of 1000 $\mu$m square regions, which are then connected to one another when in printing to form a pattern of the entire chip. Hereinafter, one of the divided regions, that is, a region to be printed at once will be referred to as a "subfield" 201. Connection of one subfield to another is done by moving both wafer and mask stage mechanically and synchronously and/or polarizing the electron beam. The silicon layer of the pattern region in each subfield 201 is as thin as 0.5 to 2 $\mu$m and fragile. Thus, a beam referred to as a strut 202 is disposed between subfields to improve the mechanical strength thereof.

Hereunder, a method for manufacturing the electron beam printing mask will be described with reference to a flowchart shown in FIGS. 3A to 3D. As shown in FIG. 3A, it is assumed here that a SOI (Silicon On Insulator) wafer in which an $SiO_2$ layer is disposed between silicon layers is used. The silicon substrate SUB is about 400 $\mu$m to 800 $\mu$m in thickness. On the substrate are formed an $SiO_2$ film of 0.1 $\mu$m, to 0.5 $\mu$m in thickness and a silicon film of 0.5 to 2 $\mu$m in thickness respectively. There are two etching methods employed for manufacturing the above electron beam printing mask; a pre-back-etching method for etching the back side of a substrate to form the strut 202 before mask patterning and a post-back-etching method for etching the back side of the substrate after the mask patterning. In this case, the pre-back-etching method will be described. The pre-back-etching method performs resist patterning to form the struts 202 at the back side of the substrate first, then the back side of the silicon substrate is etched by means of dry-etching. When the $SiO_2$ is removed, the membrane blanks to be used for the electron beam printing mask appears as shown in FIG. 3B. Then, a resist pattern 204 is formed at the back side (opposite side of the struts 202) of this membrane blanks (FIG. 3C). After this, the silicon film is removed from the substrate surface by means of dry-etching, thereby forming of the above electron beam printing mask is completed (FIG. 3D).

If a stencil type mask is used in the electron beam projection equipment at this time, it is impossible to form any non-irradiation region enclosed completely by an electron beam exposed region (aperture pattern of the mask). In addition, if the aperture ratio rises, the non-aperture region is reduced in size, thereby the mask's mechanical strength is lowered. If the aperture ratio is high, the value of the mask transmission current that passes the mask's apertures to be irradiated on the target wafer increases, thereby the Coulomb interaction works between electrons to cause a beam blur on the wafer.

In order to solve the above problem, there is a method proposed, which prints patterns in one region on a wafer by a plurality of times with the electron beam using so-called complementary masks obtained by dividing, those patterns into groups to be put into two or more masks.

The official gazette of Japanese Patent Laid-open No. H8 (1996)-236428 discloses another method for printing patterns in a target region multiply using two masks; one mask is constituted by edges of a large pattern and the other mask is constituted by the inside portion of the large pattern and fine patterns.

Furthermore, the official gazette of Japanese Patent Laid-open No. H11 (1999)-204422 discloses still another method for exposing patterns by dividing an original mask into a wide pattern mask and a narrow pattern mask, then increasing the exposure dose for the narrow pattern mask.

The entire disclosure of Japanese Patent Application No. 2001-153351 (U.S. application Ser. No. 10/083417) and Japanese Patent Application No. 2001-282546(U.S. application Ser. No. 10/171769) including specification, claims, drawings and summary are incorporated herein by reference in its entirety.

SUMMARY OF THE INVENTION

On the other hand, the method contrived by the present inventor (disclosed in JP-A No. 153351/2001) divides a mask into a plurality of masks so that the pattern density (aperture ratio) becomes approximately equal in each subfield or within each influential range of the Coulomb interaction. This is because the current value changes, thereby the beam blur caused by the Coulomb interaction comes to differ among masks if the aperture ratio differs among fields. Therefore, the complementary mask division is done so that the aperture ratio becomes approximately the same among the divided masks and the beam blur is prevented from generating an extreme difference among the masks.

In the JP-A No. 153351/2001, the aperture ratios of the mutual complementary masks are set to be not more than certain values within an influential range of the Coulomb interaction (a range smaller than a subfield, for example, a 50 µm-square region on wafer. Hereinafter, unless otherwise described specially, all the dimensional values will be described as those on a wafer scale). If the aperture ratio of layout data is high, however, the aperture ratio is not reduced enough even by such complementary mask division. This has been a conventional problem. For example, as shown in FIG. 4A, if a pattern 401 formed by large apertures (1.8 µm) and fine spaces (0.2 µm) is disposed in a region of 50 µm-square or more, the aperture ratio becomes 90%. If an adjacent aperture that will reduce the Coulomb interaction most effectively is to be divided into two masks as an example of this complementary division, the mask is divided into a mask A and a mask B as shown in FIG. 4B (each shaded portion denotes a mask aperture). As a result, the aperture ratio becomes about 45% due to such complementary mask division. Although the aperture ratio becomes a half of the previous one, the aperture ratio is still large, thereby the Coulomb interaction causes a beam blur to occur. And, as shown in FIG. 4C, a pattern resolution defect results. To suppress such beam blur, one of the effective methods is to lower the irradiation current to masks to reduce the total current that passes the mask. In this case, however, the irradiation strength (current amount) per unit region of the pattern on the wafer decreases, so that the time for exposing a total dose to form the resist pattern increases. In other words, the throughput goes down.

Furthermore, in the case of the electron projection lithography, the irradiation current to masks is basically fixed, and accordingly, there is no need to change the current in each subfield. This is why the value of the irradiation current to masks is decided according to the condition that suppresses the Coulomb blur in the subfields having the maximum aperture ratio. Consequently, exposure of all the subfields is needed with a low current that can suppress degradation of the pattern accuracy in the subfields having high aperture ratios. The throughput thus goes down. This has also been another conventional problem.

For example, if a chip has 6×6 subfields and the aperture ratio of each subfield is as shown in FIG. 6A, the chip is required to have an aperture ratio of at least 20% or less to obtain enough dimension accuracy. (The number in each circle in FIGS. 6A, 6B-1 and 6B-2 denotes a subfield having an aperture ratio of 20% or more.) If a mask is divided into two complementary masks A and B such that the aperture ratios are equal to each other, the aperture ratio of each of the two masks becomes as shown in FIG. 6B-1 (mask A) and in FIG. 6B-2 (mask B). As a result, there come to appear some subfields 601 (shaded portions) having an aperture of 20% or more respectively. The electron beam projection equipment is thus required to reduce the current for printing patterns requiring high dimension accuracy in each of such the subfields 601. However, the value of the irradiation current to masks cannot be changed in each subfield. Therefore, if any one of the several thousands of subfields on a chip has an aperture ratio of 20% or more, such as those 601 shown in FIG. 6B-1 and FIG. 6B-2, and it includes any pattern requiring high dimension accuracy, the current must be lowered for the printing, thereby the throughput comes to be limited.

If a large region pattern 501 as shown in FIG. 5A is to be divided complementarily into fine patterns in a predetermined area size (FIG. 5B), each fine pattern may be put into the mask A (FIG. 5C-1) or B (FIG. 5C-2). If the complementary division is done while the shape of the pattern as shown in FIG. 5B is kept as is at this time, so-called doughnut patterns will appear. Thus, corners of each of the fine pattern must be rounded. Consequently, the following problem arises; some fine patterns come to dangle in space 502, which support rectangular patterns at their corners as shown in FIGS. 5C-1 and 5C-2, so that the mechanical strength becomes lowered.

Japanese Patent Laid-open No. H8 (1996)-236428 discloses still another method for using the same mask for the internal portion of a comparatively large pattern and individual fine aperture patterns while another mask is used only for the frame of the large pattern to suppress the Coulomb interaction influence at the time of beam irradiation to the internal portion of the large pattern. In this case, however, the internal portion of the large pattern except for the frame thereof and individual fine aperture patterns are disposed in the same mask and the aperture ratio of the mask is still kept large comparatively, thereby the Coulomb interaction might degrade the resolution of the fine aperture patterns. This has been still another conventional problem.

Furthermore, the Japanese Patent Laid-open No. H11 (1999)-204422 discloses still another method for using different masks for the wide and narrow aperture patterns to suppress the resist heating, thereby the former wide patterns are exposed by a low dose while the latter narrow patterns are exposed by a high dose. In this case, however, the technique has been confronted with a problem that patterns cannot be exposed appropriately to the exposure characteristics of each pattern, thereby the exposure is not done by the optimal dose. And, the conventional technique has also been confronted with still another problem that the electron beam projection equipment configured as usually cannot change the irradiation current for each of those masks appropriately. Further, the conventional technique has still another problem that all the aperture patterns are disposed only in one of the two masks when wide aperture patterns gather densely as shown in FIGS. 4A to 4C.

Furthermore, none of the Japanese Patent Laid-open No. H8 (1996)-236428 and No. H11 (1999)-204422 discloses any range on a mask, in which the aperture ratio should be taken into consideration. This is why the conventional techniques come to be confronted with still another problem that complementary mask division is not done in consideration of the aperture ratio within the influential range of the Coulomb interaction.

Under such circumstances, it is an object of the present invention to provide a method for manufacturing semiconductor devices, which can form patterns at high accuracy and a high throughput with use of electron beam projection equipment that uses complementary masks.

The above objects of the present invention are achieved first by disposing patterns requiring high dimension accuracy in a first mask region and other patterns in a second mask region with use of the electron projection lithography when a mask is divided complementarily for a pattern that includes regions requiring an aperture ratio of a predetermined value or more within the influential range of the Coulomb interaction.

In this connection, the pattern requiring high dimension accuracy should preferably be fine aperture patterns having a first predetermined dimension or less, or aperture pattern region having a predetermined width that includes sides of aperture patterns disposed adjacently at fine spaces of a second predetermined dimension or less. Furthermore, the pattern requiring high dimension accuracy may be a gate pattern on an active region or both of a gate pattern on an active region and a pattern connected to the gate pattern in the periphery.

Such complementary mask division can reduce the aperture ratio of the mask that includes fine patterns or patterns requiring high dimension accuracy, thereby the resolution is improved. In addition, because fine patterns and patterns requiring high dimension accuracy are gathered in the first mask region, the second mask region comes to include comparatively large patterns, that is, rough patterns that are not requiring such high dimension accuracy as that of the first mask region. Generally, the aperture ratio becomes high in the second mask region, but there is no need to lower the irradiation current there to improve the printing accuracy, since the region includes only rough patterns. The current value can thus be decided in accordance with the first mask region having low aperture ratios, thereby the throughput is lowered.

Next, a description will be made for a method for improving the throughput according to the present invention more in detail with reference to FIG. 19. In the upper half of FIG. 19 is shown a relationship between an irradiation current to masks and pattern dimension errors when the mask aperture ratio is changed. In the lower half of FIG. 19 is shown a relationship between the irradiation current to masks and the throughput. Pattern dimension errors are caused by various factors such as a mask dimension, non-uniformity of the current among subfields, etc. Generally, however, the error becomes larger in proportion to an increase of the beam blur on wafer. As a result, the larger the aperture ratio or irradiation current increases, the larger the mask transmission current becomes, and the larger the mask transmission current becomes, the more the beam blur increases. Consequently, the pattern dimension error becomes large. On the other hand, the exposure time is in proportion to the required dose/irradiation current to masks, so that the throughput increases together with the irradiation current to masks. Here, the dimension accuracy required for fine patterns is defined as Afine and the accuracy required for rough patterns is defined as Arough. If a mask is divided complementarily so that two complementary masks become equal in aperture ratio D2, fine patterns are usually put into both of the two complementary masks. In order to suppress the exposure error of each mask at Afine or less, therefore, the current becomes I1, thereby the throughput becomes TP1. On the other hand, the present invention premises that a mask is divided complementarily so that only one of the two masks includes fine patterns and the aperture ratio of the mask is defined as D1 and the aperture ratio of the other is defined as D3. (In this connection, it is also assumed that the aperture ratio of the mask that includes fine patterns is smaller than that of the other mask. This assumption will be satisfied in most cases as to be described in the embodiments of the present invention. The exceptions will also be described in those embodiments.) To suppress each dimension error within a predetermined allowable value, the current becomes I2, thereby the throughput becomes TP2. The present invention can thus improve the throughput.

BRIEF DESCRIPTION OF THE DRAWINGS

FIGS. 2A to 2C show structure of an electron beam printing mask, in which FIGS. 2A and 2B show bird's eye views and FIG. 2C shows a top view;

FIGS. 4A to 4C are charts for describing problems to rise from the patterns printed with use of conventional complementary masks, in which FIGS. 4A and 4B show top views of mask patterns and FIG. 4C shows a top view of a resist pattern;

FIGS. 5A, 5B, 5C-1, and 5C-2 are top views of mask patterns for describing problems to rise from complementary masks divided from a conventional mask;

FIGS. 6A, 6B-1, and 6B-2 are charts for describing the aperture ratio (unit: %) of each subfield divided on one chip;

FIGS. 7A, 7B-1, and 7B-2 are top views of mask patterns divided complementarily, in which FIG. 7A shows design patterns, FIG. 7B-1 shows the mask A, and FIG. 7B-2 shows the mask B;

FIGS. 8A-1 and 8A-2 are top views of pattern data of the mask A;

FIG. 15 is another flowchart of complementary mask division for pattern data according to the present invention;

FIGS. 16A, 16B-1, 16B-2, 16C-1, and 16C-2 are charts for describing the distribution of aperture ratios in the subfields of a chip;

FIGS. 17A, 17B, 17C-1 and 17C-2 are charts for describing the distribution of aperture ratios, in which FIG. 17A shows the aperture ratio in each subfield of one chip, and FIGS. 17B, 17C-1, and 17C-2 show the aperture ratio in each Coulomb region in one subfield;

FIGS. 18A, 18B-1, 18B-2, 18C-1, and 18C-2 are charts for describing the distribution of aperture ratios in each subfield of a chip;

FIGS. 20A, 20B-1, and 20B-2 are top views of subfields of a chip;

DETAILED DESCRIPTION OF THE PREFERRED EMBODIMENTS (First Embodiment)

Hereunder, the preferred embodiments of the present invention will be described with reference to the accompanying drawings. At first, a description will be made for the first embodiment, which is a method for dividing a mask complementarily to form some of the gate layer patterns with reference to FIGS. 1A, 1B, 1C-1 and 1C-2. The selected patterns that require specially high dimension accuracy are formed on an active layer.

FIGS. 1A, 1B, 1C-1 and 1C-2 show mask data of active regions 102 of a MOSLSI and gate patterns 101 formed on the active regions. In FIGS. 1A, 1B, 1C-1 and 1C-2, the gate patterns 101 on the active regions 102 are 0.08 $\mu$m and 0.12 $\mu$m in width. In a range up to at least at a portion separated by 0.15 $\mu$m from the active region, each gate pattern is laid out at the same width of the gate pattern on the active region 102 in consideration of the total errors of both gate layer and active region. In other regions, the gate patterns are laid out at the minimum line width of 0.12 $\mu$m.

Figure 1A:
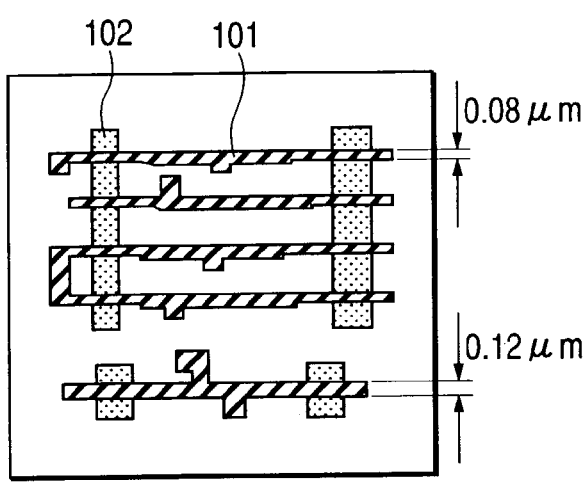
FIGS. 1A, 1B, 1C-1, and 1C-2 are top views of patterns for describing a mask complementary division method of the present invention.
Figure 1B:
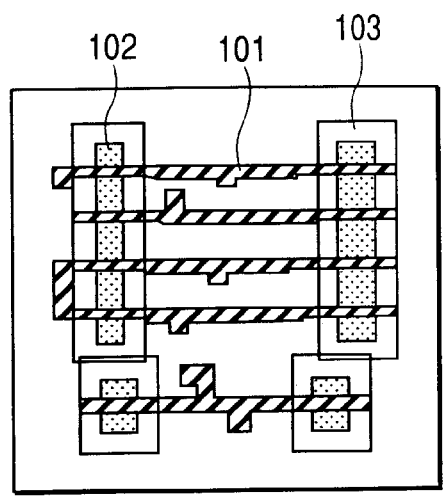
Figures 1, 1C:
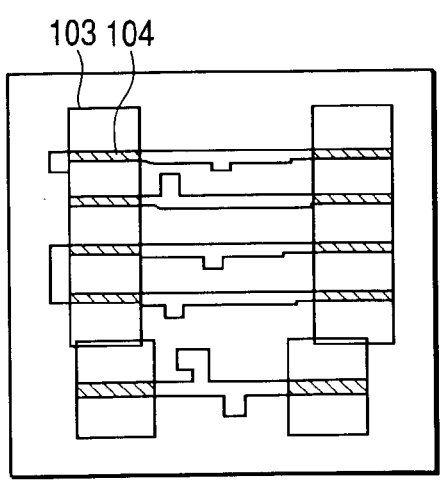
Figures 1, 1C, 2:
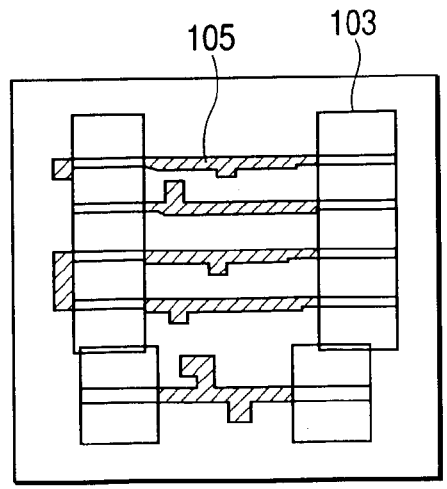
Figure 2A:
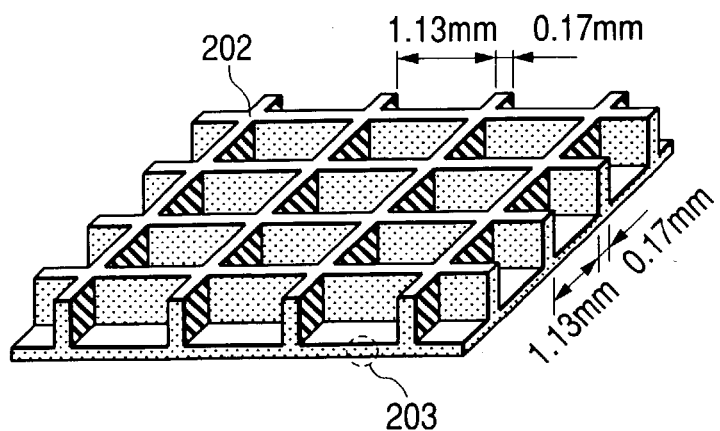
Figure 2B:
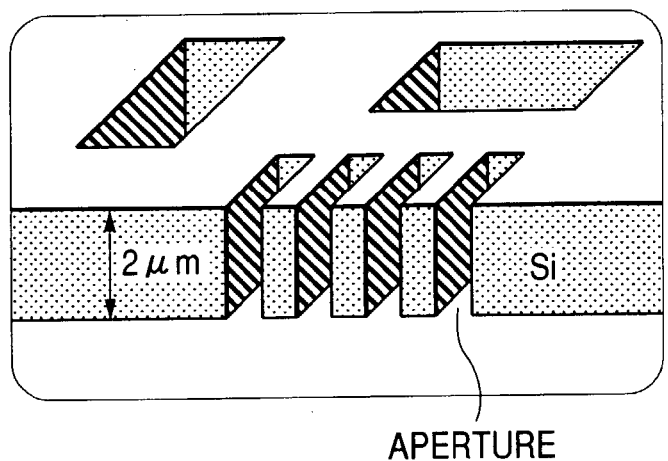
Figure 2C:
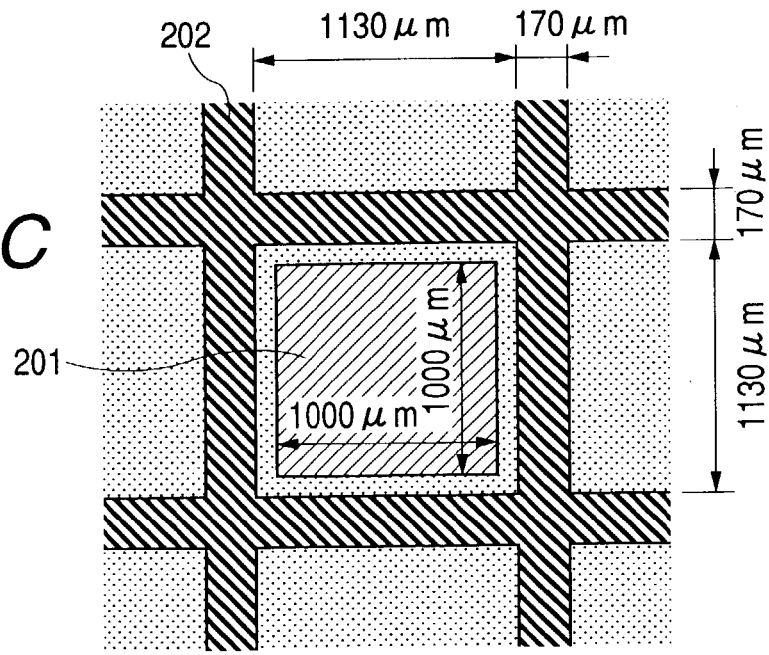
Figure 3A:
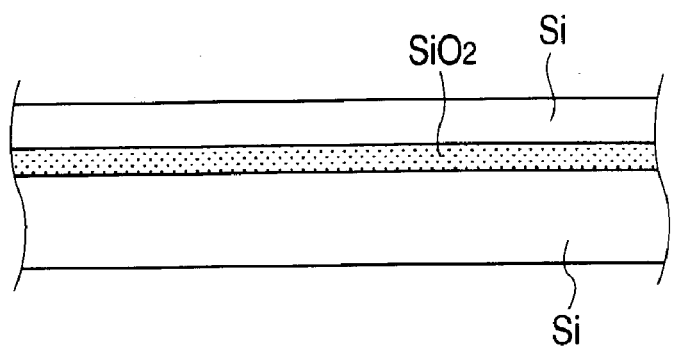
FIGS. 3A to 3D are cross sectional views of an electron beam printing mask for describing a manufacturing flow of the mask.
Figure 3B:
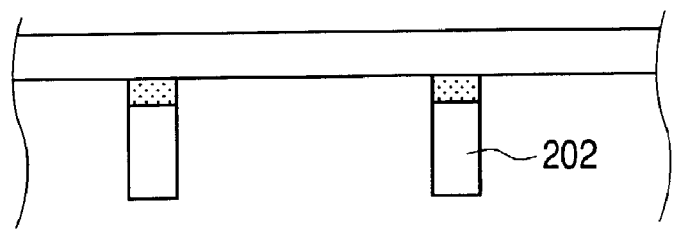
Figure 3C:
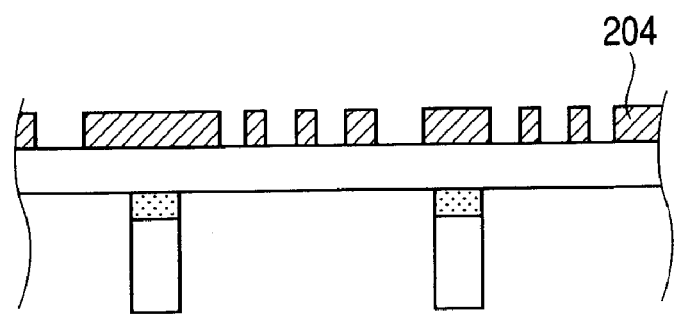
Figure 3D:
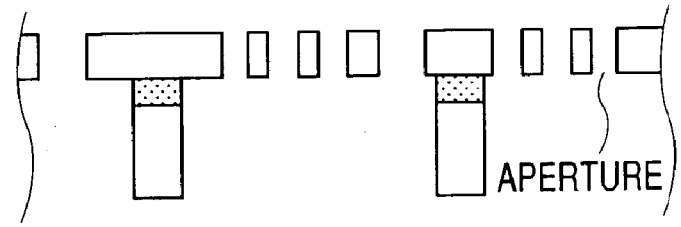
Figure 4A:
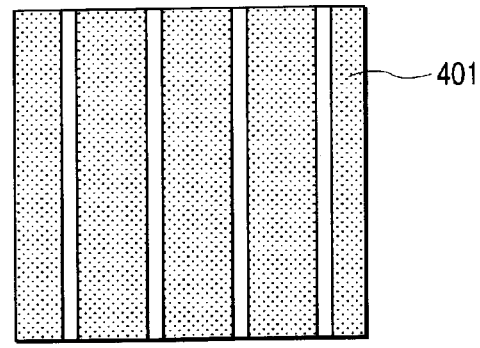
Figure 4B:
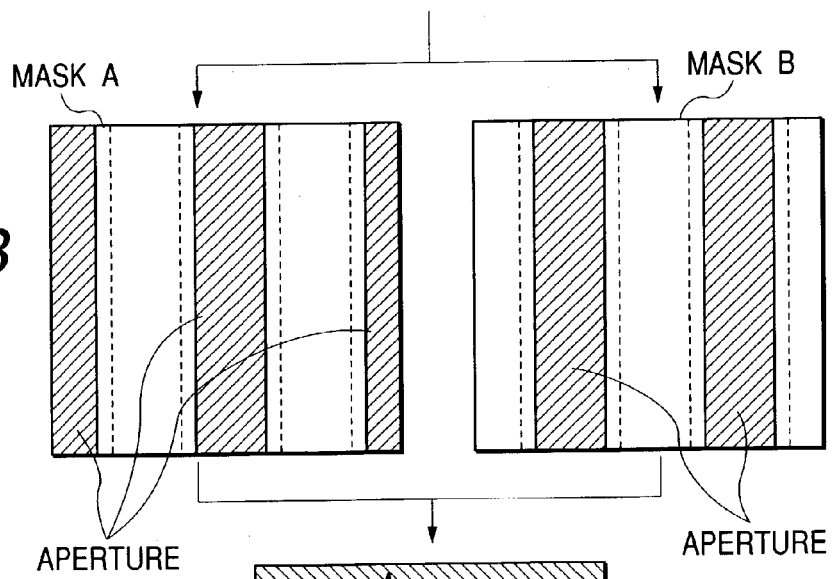
Figure 4C:
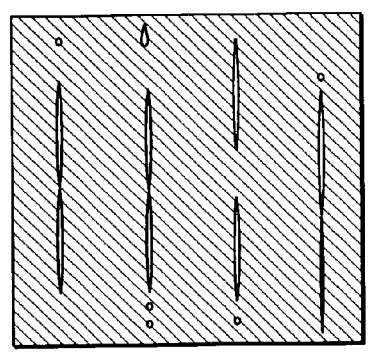
Figure 5A:
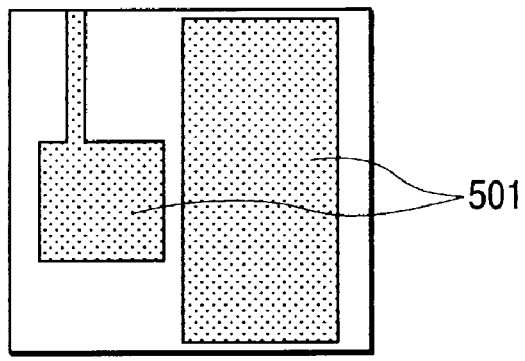
Figure 5B:
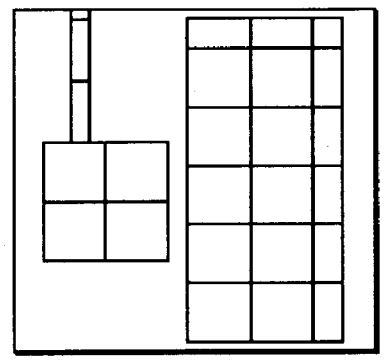
Figures 1, 5C:
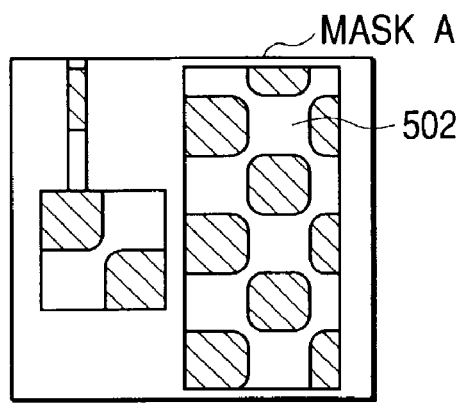
Figures 2, 5C:
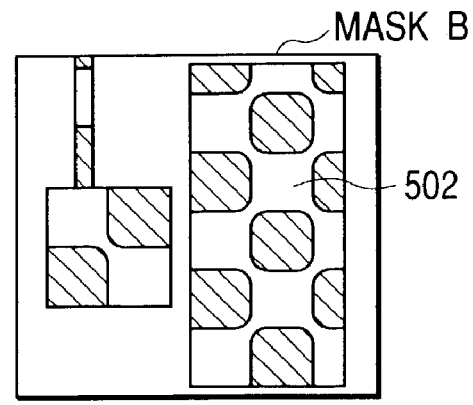

Here, only the gate patterns 104 located inside by 0.15 $\mu$m from each active region 102 are extracted by logical multiplication of the pattern 103 and the gate layer pattern 101 to obtain the mask A (FIG. 1C-1) and put other patterns 105 into the mask B (FIG. 1C-2). The pattern 103 is obtained by expanding the active region pattern 102 of the gate pattern 101 shown in FIGS. 1A, 1B, 1C-1 and 1C-2 by 0.15 $\mu$m in a graphical operation.

While the gate patterns in the region obtained by expanding an active region pattern by 0.15 $\mu$m are extracted for the mask A requiring high accuracy, all the portions laid out by thin lines just like the 0.08 $\mu$m pattern may be put into the mask A.

If a gate pattern disposed on an active region at the time of designing is in another layout layer, the data in the gate pattern layer on the active region may be assumed as the mask A data as is.

Furthermore, in order to avoid the discontinuation of the pattern wiring to be caused by an offset in alignment of the masks A and B when in printing, the masks A and B may be overlapped. One of the methods for overlapping the masks A and B such way is to AND the pattern expanded from the pattern 104 only by the maximum offset value (ex., 30 nm) and the pattern 101. If the alignment error of the electron beam projection equipment is small, the overlapped portion may be reduced, of course.

The complementary division as described above will thus enable the mask A to be constituted by patterns in regions requiring high dimension accuracy and the mask B to be constituted by other patterns. Generally, the area of each gate pattern on the active region is smaller than that of patterns in other portions of the same gate layer, so that the aperture ratio of the mask A becomes smaller than that of the mask B. Consequently, a small current passes the mask, thereby the Coulomb interaction goes down. The beam blur is thus reduced, thereby fine and highly accurate patterns can be printed. On the other hand, the aperture ratio of the mask B increases, thereby the beam blur also increases. However, because patterns to be printed through the mask B are not requiring high dimension accuracy, no problem arises from such beam blur.

(Second Embodiment)

This second embodiment describes a method for dividing a mask into complementary masks in consideration of the required accuracy of the gate patterns.

Figure 7A:
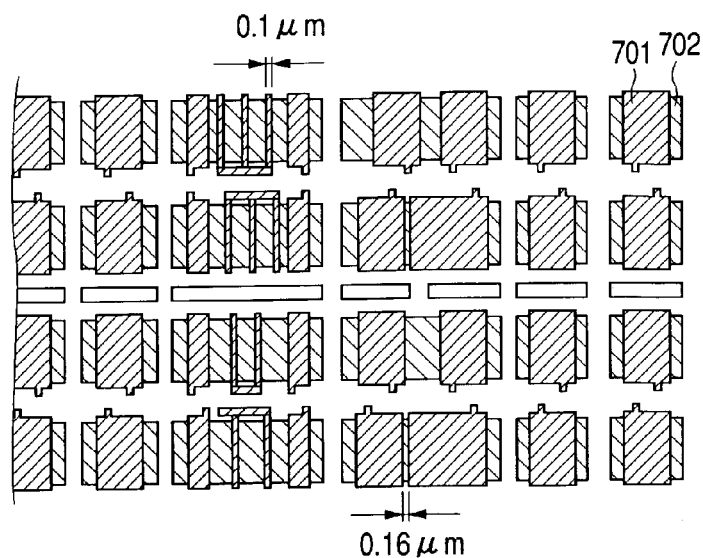

FIG. 7A shows gate patterns 701 and active region patterns 702. Each gate pattern 701 is drawn at the minimum pattern width of 0.1 $\mu$m and at the minimum pattern space of 0.16 $\mu$m. If both thick and thin gates co-exist, almost all the gates are located on active regions, and the mask is divided just like in the first embodiment, then the aperture of the mask that includes the patterns on the active regions becomes higher than those of other masks. To avoid this, the mask is divided into two complementary masks so that the aperture ratio of the mask that includes shorter gate patterns of those located on the active regions becomes lower. In other words, patterns having a width of a predetermined value or less and the edges of aperture patterns adjacent to those patterns at predetermined spaces or less are extracted to form a low aperture ratio mask.

Figures 1, 7B:
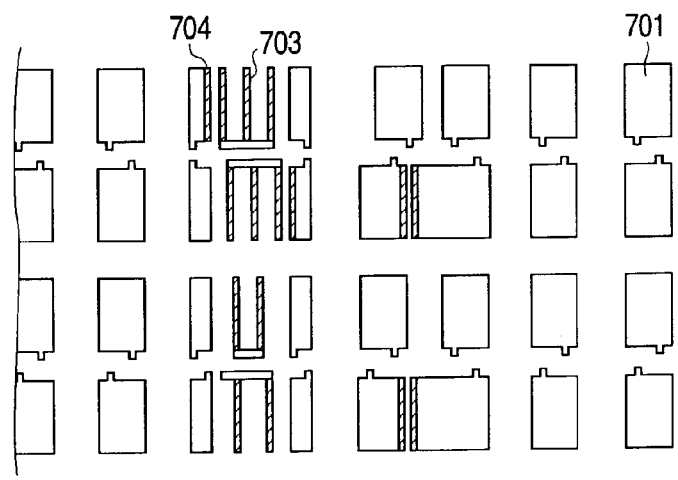
Figures 2, 7B:
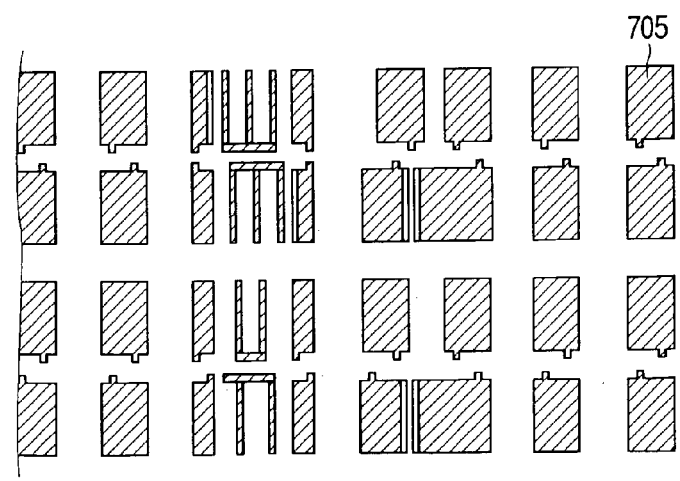

In this case, as shown in FIG. 7B-1, the mask A is formed by the aperture pattern 703 of 0.15 $\mu$m or less and the aperture pattern 704 of 0.15 $\mu$m width located at the edges of the 0.18 $\mu$m-or-less adjacent aperture patterns. The mask B is formed so as to include other patterns as shown in FIG. 7B-2.

The complementary mask division as described above has made it possible to lower the aperture ratio of the mask A that includes the patterns 703 and 704 requiring high printing accuracy. On the other hand, the aperture ratio of the mask B becomes high while the mask B is formed only with thick patterns not requiring high dimension accuracy. Consequently, patterns are formed within required dimension accuracy even under significant influence of the Coulomb interaction.

If the isolation resolution is enabled even at narrow aperture pattern spaces, the mask A may be formed only with thin aperture patterns. In this connection, the aperture ratio of the mask A can further be lowered, thereby the Coulomb interaction is more suppressed when fine aperture patterns are formed.

Figures 1, 8A:
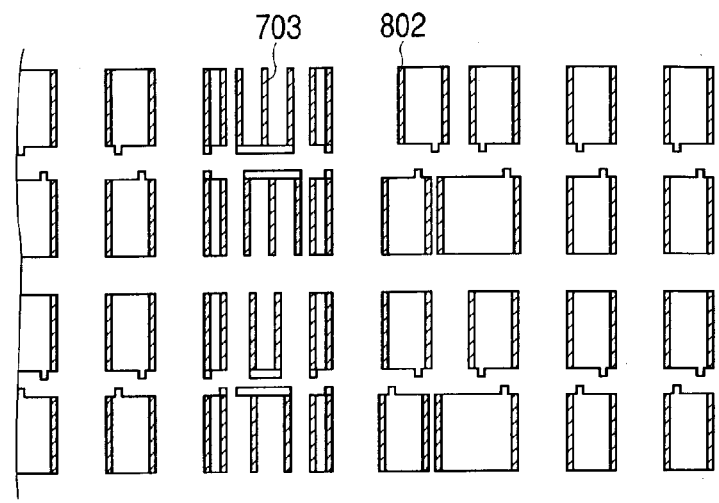
Figures 2, 8A:
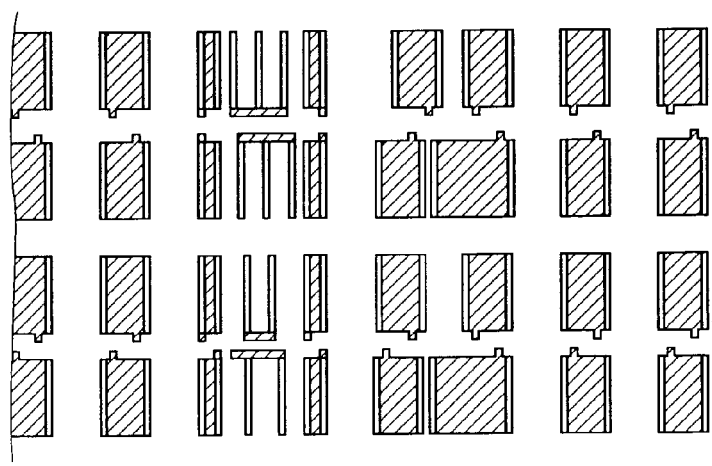

Furthermore, if thick gates also require the same accuracy as that of thin gates, all the edge patterns 802 (only in the vertical direction with respect to the gate length) of the thick gate patterns may be included in the mask A while other patterns are included in the mask B (FIG. 8A-2). In this connection, the dimension accuracy of the thick gates are also improved.

The width of the edges 704 and 802 of the thick gates included in the mask A may be identical to or different from that of the thin patterns.

(Third Embodiment)

Figure 14:
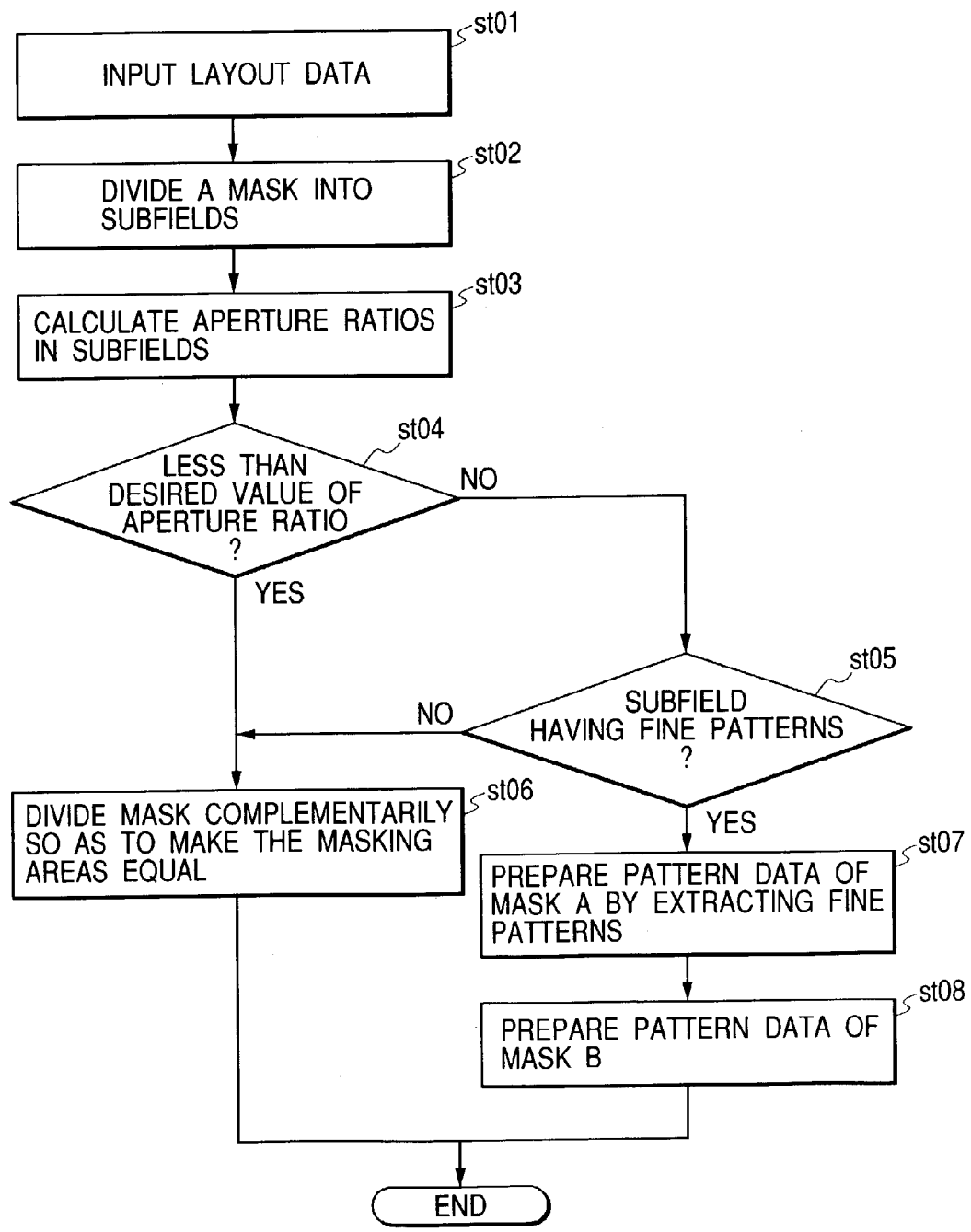
FIG. 14 is a flowchart of complementary mask division for pattern data according to the present invention.
Figure 19:
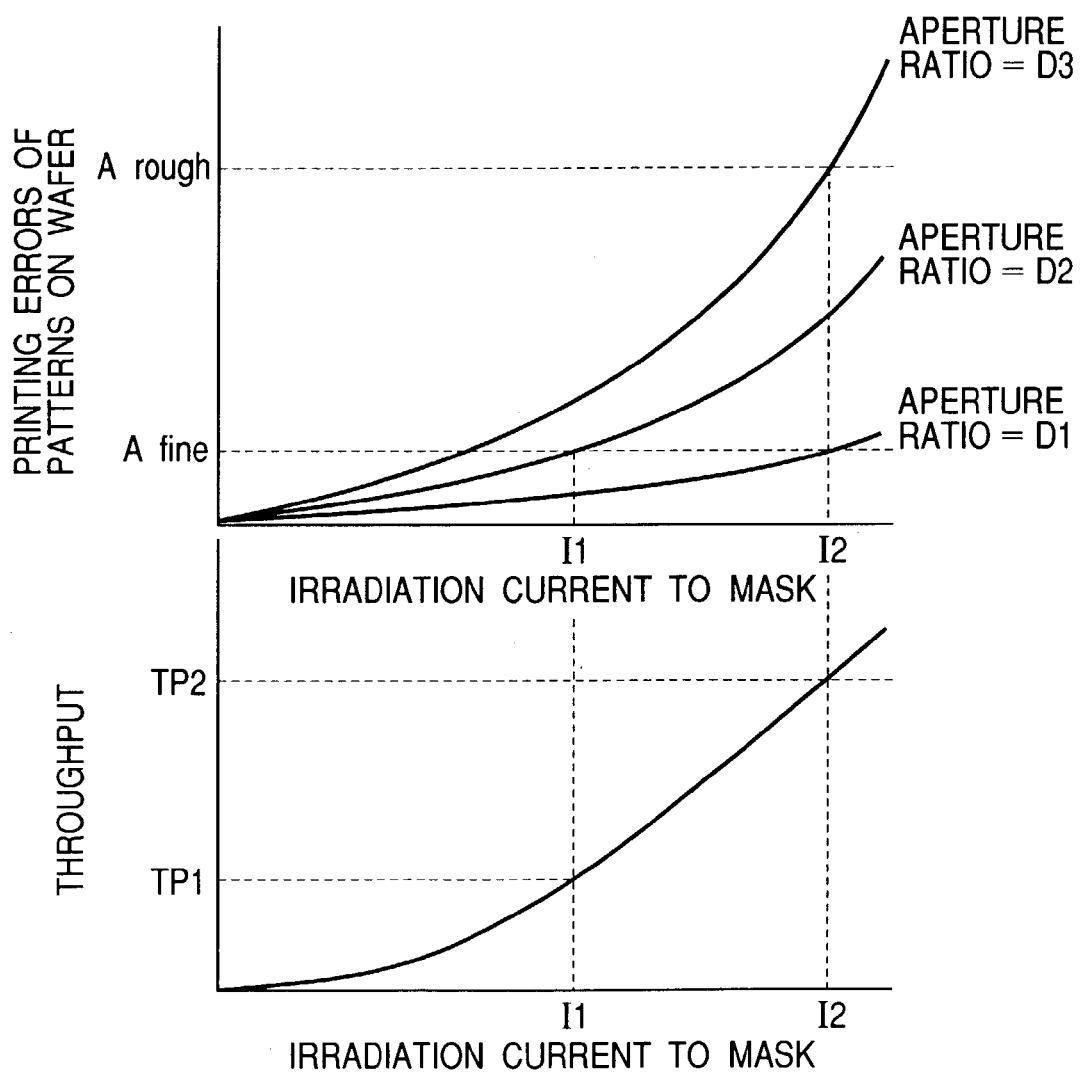
FIG. 19 is graphs for denoting how both of the irradiation current to masks and the pattern dimension error will change (upper half) and how both of the irradiation current to masks and the throughput will change (lower half) according to the changes of the mask aperture ratio.

Next, a description will be made for the complementary mask division to be made when subfields are in the influential range of the Coulomb interaction with reference to the flowchart shown in FIG. 14. The patterns in the object layer are laid out at the minimum width of 0.8 $\mu$m and at the minimum spaces of 0.08 $\mu$m. In this connection, the aperture ratio of each subfield must be under 20% so as to meet the utilization condition of the electron beam projection equipment to realize the accuracy of 10 nm or less for patterns of not more than 0.1 µm width to be irradiated by the electron beam and not to be irradiated by the electron beam (hereinafter, to be referred to as fine patterns).

On a chip constituted by 6×6 subfields, the aperture ratio of each subfield is decided as shown in FIG. 16A. In FIGS. 16A, 16B-1, 16B-2, 16C-1, and 16C-2, each subfield whose aperture ratio value is encircled has an aperture ratio that exceeds 20%. On the other hand, each shaded subfield includes fine patterns. In other words, each encircled and shaded subfield 1601 has an aperture ratio of 20% or more while it includes fine patterns under 100 nm. Each non-circled and shaded subfield 1602 includes fine patterns under 100 nm while it has an aperture ratio under 20%. Each encircled and non-shaded subfield 1603 does not include any fine pattern while it has an aperture ratio of 20% or more. Each non-encircled and non-shaded subfield 1604 has no fine pattern while it has an aperture ratio under 20%.

At first, layout data is inputted (st01), then the whole chip is divided into 250 µm square subfields (st02). After this, the aperture ratio of each subfield is calculated (st03) and it is checked if the aperture pattern density is under 20% (st04). If the density is 20% or more, it is checked if the subfield includes fine patterns (st05). Then, subfields 1601 that have an aperture ratio of 20% or more and include fine patterns respectively are extracted. The patterns in the extracted subfields 1601 are divided into fine patterns and other patterns (hereinafter, to be referred to as rough patterns), then the mask is divided complementarily so that the mask A includes only the fine patterns while the mask B includes rough patterns. How to divide patterns into fine patterns and rough patterns will be described later in another embodiment.

On the other hand, for the subfields having an aperture ratio of 20% or more and including no fine pattern, as well as for the subfields having an aperture ratio under 20%, the conventional complementary mask division method is used to divide those subfields equally between the mask A and the mask B.

FIGS. 16B-1 and 16B-2 show the aperture ratios of the masks A and B. The aperture ratio of the subfields (shaded) of the mask that includes fine patterns can be set under 20% for both of the masks A and B, thereby patterns are formed with less beam blur occurrence and enough dimension accuracy. Both of the masks A and B include subfields (encircled) having an aperture exceeding 20% respectively. However, those subfields includes only rough patterns (not shaded) requiring not so high dimension accuracy, so that the patterns are formed within desired resolution accuracy even when the beam blur is comparatively large.

On the other hand, if complementary mask division is done so that the aperture ratio becomes equal among all the subfields, the aperture ratios of some subfields 1601 (encircled and shaded) come to exceed 20% as shown in FIGS. 16C-1 and 16C-2 even when they includes fine patterns. Therefore, the current must be lowered to print the fine patterns in those subfields at enough dimension accuracy, thereby the throughput falls.

It is also possible to have the mask A include fine patterns and the mask B include rough patterns not by dividing the subfields 1602 including fine patterns, but having aperture ratios under 20% equally. In addition, it is also possible to put all the patterns in the subfields into the mask A or B without doing complementary mask division.

Furthermore, the subfields 1603 and 1604 including no fine pattern can be disposed in the mask A or B without doing complementary mask division. And, after complementary division is done for the subfields 1601 just like in this embodiment, it is possible to select non-complementary division or complementary division for the subfields 1602, 1603, and 1604 respectively so that the total aperture ratio becomes equal between the masks A and B.

The pattern data used for scanning masks can be reduced and the scanning can be speeded up for subfields other than those including fine patterns and having high aperture ratios when no complementary division is done. On the other hand, the mask strength can be equalized between masks if the same aperture ratio is set for both of the masks A and B.

(Fourth Embodiment)

This fourth embodiment describes a complementary mask division method used when the Coulomb interaction influential range is smaller than each subfield. The layout layer in this embodiment is the same as that in the third embodiment. Just like in the third embodiment, fine patterns under 100 nm cannot realize desired design dimension accuracy of ±10 nm unless the aperture ratios of the peripheral subfields are under 20%. In the third embodiment, the Coulomb interaction influential range matches with each subfield. Thus, the total aperture ratio of all the subfields is evaluated. However, because the Coulomb interaction influential range of the electron beam projection equipment used here is 50 µm, which is smaller than each subfield, the aperture ratio is evaluated in a 50 µm square region partitioned in each subfield (hereinafter, this region will be referred to as a Coulomb region).

Figures 17A, 17B, 17C-1, 17C-2:
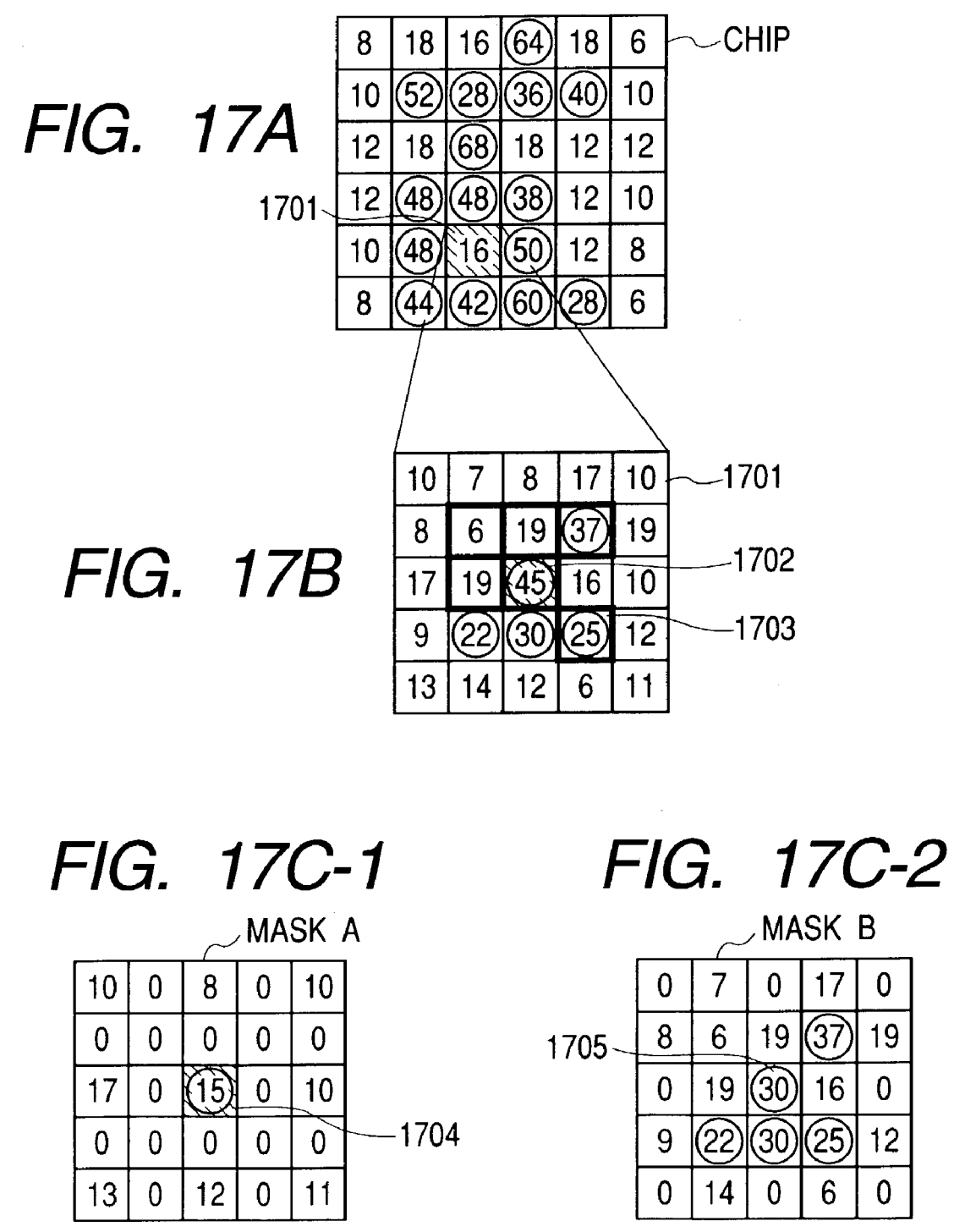

For example, the aperture ratio of each subfield on a chip constituted by 6×6 subfields (250 µm square/subfield) is as shown in FIG. 17A and one of the subfields 1701 includes fine patterns. The aperture ratio of the subfield 1701 is 16%, which is under 20%. The subfield 1701 is then divided into 50 µm square Coulomb regions and the aperture ratio of each Coulomb region of the 5×5 Coulomb regions is checked and found to be as shown in FIG. 17B. One of the 25 Coulomb regions 1702 shown in FIG. 17B has an aperture ratio of 20% or more and includes fine patterns.

Because the Coulomb region 1702 includes fine patterns and has a high aperture ratio, only the fine patterns are extracted from this region 1702 and disposed in the mask A and other patterns are disposed in the mask B. In addition, if any fine pattern exists near the boundary of the Coulomb region 1702, the patterns in the Coulomb region 1703 (Coulomb regions in a thick-line frame, that is, eight Coulomb regions around the Coulomb region 1702) that might raise the peripheral aperture ratios of the fine patterns are disposed in the mask B. The patterns in other Coulomb regions never affect the fine patterns in the Coulomb region 1702, so that they may be disposed in any of the masks A and B. Here, patterns in the same Coulomb region are collected and disposed in alternately different masks so as to save the complementary division time in each Coulomb region and avoid concentration of patterns only in either of the masks A and B.

The aperture ratio of each Coulomb region in the subfield 1701 in the masks A and B thus becomes as shown in FIGS. 17C-1 and 17C-2. The Coulomb region 1702 including fine patterns and having a high aperture ratio within the Coulomb interaction influential range is divided into two Coulomb regions 1704 disposed in the mask A and 1705 disposed in the mask B. As a result, the aperture ratio of the Coulomb region 1704 including fine patterns falls to 15%, thereby the patterns are formed at high dimension accuracy.

(Fifth Embodiment)

In the third embodiment, regions are divided into those requiring high dimension accuracy and other regions to reduce the aperture ratio of each region requiring high dimension accuracy. If regions requiring high dimension accuracy are extracted such way, however, the aperture ratios of those regions come to rise sometimes. Next, a description will be made for a method for avoiding such a problem with reference to a flowchart shown in FIG. 15 and the charts shown in FIGS. 18A, 18B-1, 18B-2, 18C-1, and 18C-2.

FIGS. 18A, 18B-1, 18B-2, 18C-1, and 18C-2 show a chip that is divided into 250 $\mu$m square subfields and the aperture ratio of each of those subfields disposed like a 6×6 matrix. Just like in the third embodiment, the aperture ratio of each subfield must be set under 20% to form fine patterns on the chip at desired dimension accuracy. In FIGS. 18A, 18B-1, 18B-2, 18C-1, and 18C-2 similarly to FIGS. 16A, 16B-1, 16B-2, 16C-1, and 16C-2, each encircled aperture ratio value denotes a subfield having an aperture ratio of 20% or more. Each shaded subfield includes fine patterns. Each of the four subfields 1801 enclosed in a dotted line frame includes a SRAM memory cell, so that it includes fine patterns and has a high aperture ratio.

Figures 18A, 18B-1, 18B-2, 18C-1, 18C-2:
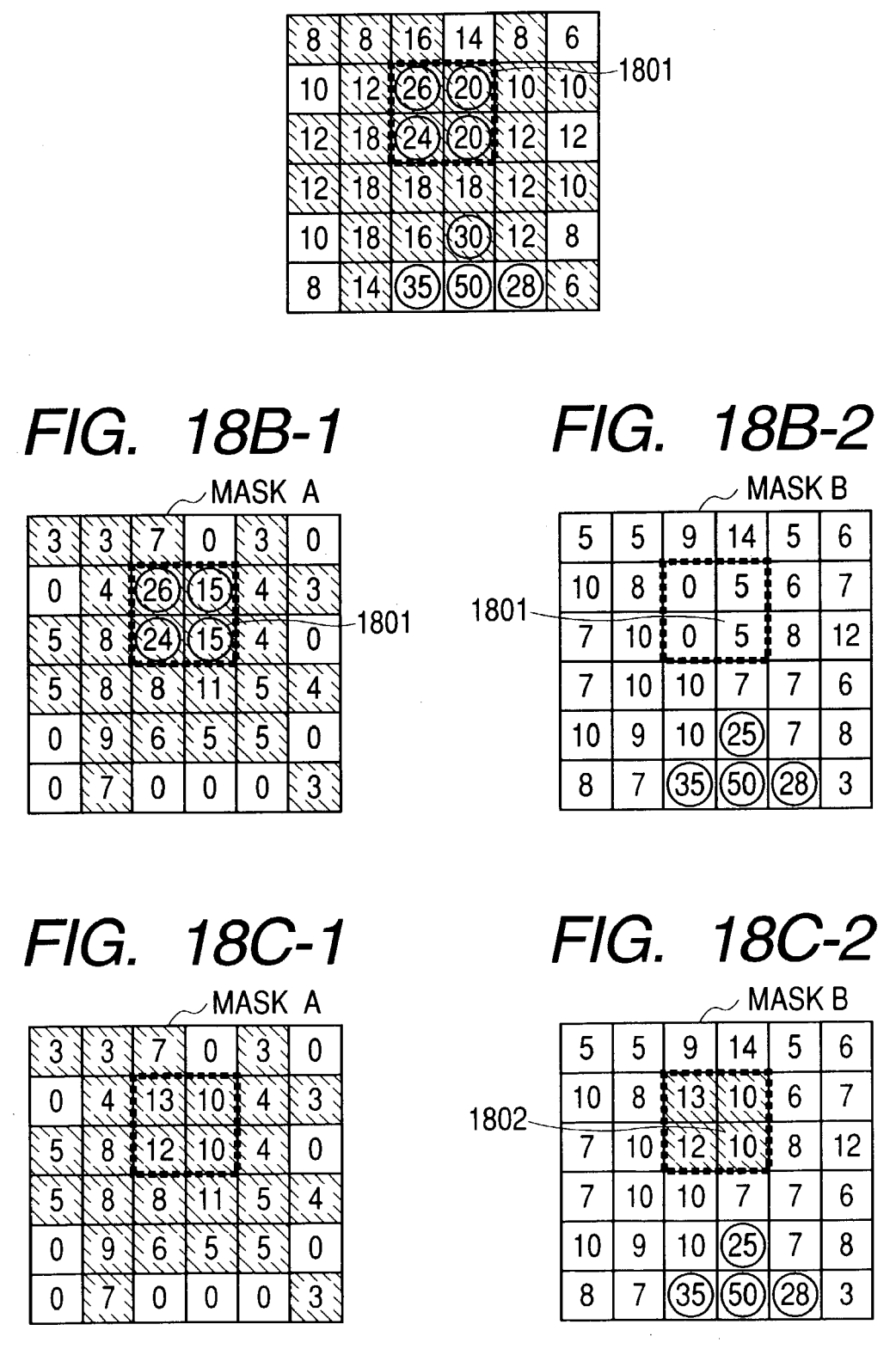

If a pattern in which aperture ratios are distributed as shown in FIG. 18A is to be divided into patterns complementarily, at first, the pattern is divided into subfields (st02), then it is checked if each subfield includes fine patterns (st05). Each subfield including no fine pattern is disposed in the mask B (st10). On the other hand, subfields including fine patterns are divided into those including fine patterns to be disposed in the mask A and others to be disposed in the mask B (st07 and st08). FIG. 18B-1 shows the mask A and FIG. 18B-2 shows the mask B with respect to the aperture ratios obtained as a result of the above division. The four subfields 1801 enclosed in a dotted line frame include patterns that are almost memory blocks constituted by fine patterns respectively. Thus, most of the patterns come to be included in the mask A if complementary mask division is done so that fine patterns are disposed in the mask A and rough patterns are disposed in the mask B, thereby the aperture ratio of the mask A rises. Consequently, the pattern accuracy of the mask A becomes lower than that of the mask B.

To avoid this, the aperture ratio is compared between the masks A and B (st09). When the aperture ratio of the mask A is higher than that of the mask B, the mask is divided into two masks so that the aperture ratio becomes equal between the two masks (st06).

The aperture ratios thus become as shown in FIGS. 18C-1 and 18C-2. Although the mask B includes a subfield 1802 that includes fine patterns, the maximum aperture ratio of the subfields of the masks A and B, which include fine patterns, becomes 13%, which is lower than the maximum aperture ratio (26%) assumed when fine patterns are gathered in the mask A as shown in FIG. 18B-1. Consequently, fine patterns are formed without lowering the current value, thereby the throughput is prevented from being reduced.

In the above example, the aperture ratio is compared between fine patterns and rough patterns after they are divided. However, if memory and other patterns can be divided in the design data, it is also possible to divide the memory pattern, etc. into equal-size regions and divide other patterns into fine patterns and rough patterns.

In the case of such parts as a DRAM constituted almost by fine patterns and having aperture ratios of nearly 50%, it would be better to divide those patterns into equal-size regions rather than dividing them into fine patterns and rough patterns to be put into two masks, in order to lower the aperture ratio of each subfield that includes fine patterns. In this connection, the aperture ratio of the DRAM block becomes 25%, which exceeds the required aperture ratio of 20% for forming fine patterns within the required accuracy. In this case, however, if the irradiation current to masks is suppressed to about ⅘, the fine patterns in the DRAM block and the fine patterns in the logical block can be formed at the same accuracy. And, if all the patterns in the DRAM block are put into the masks A, the aperture ratio of the masks A becomes 50%. Therefore, the irradiation current to masks must be suppressed to ⅖ for forming patterns with in the required accuracy. The throughput thus goes lower than that obtained by this method. Further, the memory block may be low in required accuracy in some cases. In this case, pattern printing is enabled without reducing the irradiation current to masks.

(Sixth Embodiment)

Figure 9:
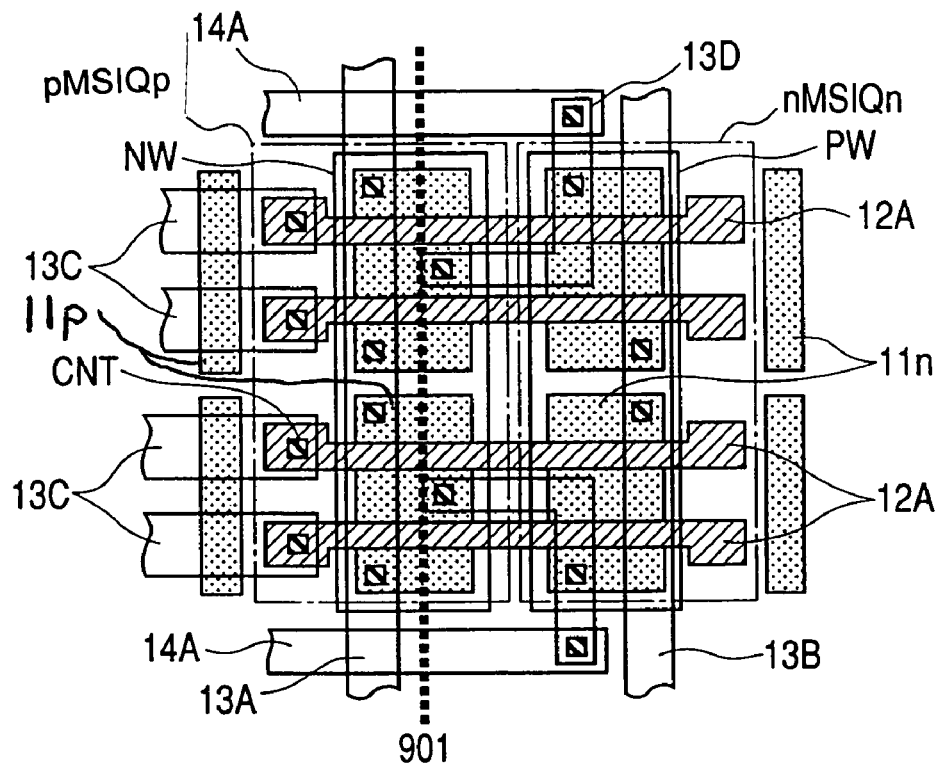
FIG. 9 is a top view of a major portion of a semiconductor integrated circuit device.

Next, a description will be made for a method for manufacturing a semiconductor integrated circuit device concretely. In this embodiment, it is assumed that the present invention applies to a semiconductor integrated circuit device manufactured by a semi-custom method employed for gate arrays, standard cells, etc. and the device is provided with a custom I/O (input/output) circuit and a custom logic circuit or I/F (interface) control circuit formed on the semiconductor substrate. FIG. 9 shows a top view of some logical elements in the semiconductor integrated circuit device. In this case, the device includes two nMISQn's and two pMSIQp's. Then MISQn's are formed in the n-type semiconductor region 11n on the surface of the p-type well region PW and the pMISQp's are in the p-type semiconductor region 11p on the surface of the n-type well region NW formed on the semiconductor substrate respectively. Each gate electrode 12A is shared by both nMISQn and pMISQp. The gate electrode 12A is formed by a single film made of low resistive polycrystalline silicon in a polycide structure provided with a silicide on top of the low resistive polycrystalline silicon film, a metal structure formed by depositing a metal film made of, for example, tungsten or the like on the low resistive polycrystalline silicon film through a barrier film made of, for example, tungsten nitride or the like, or damascene gate electrode structure formed by depositing a barrier film made of, for example, titanium nitride or the like in a trench formed in an insulator film, then embedding a metal film made of, for example, copper or the like thereon. The semiconductor substrate block under the gate electrode 12A is used as a channel region.

Wiring 13A supplies a high potential side power of, for example, 3.3V or 1.8V and it is connected electrically to a p-type semiconductor region 11p of the two pMISQp's through a contact hole CNT. Wiring 13B supplies a low potential side power of, for example, 0V and it is connected electrically to an n-type semiconductor region 11n of one nMISQn through the contact hole CNT. Wiring 13C is an input line to a 2-input NAND gate circuit and it is connected electrically to a wider portion of the gate electrode 12A through the contact hole CNT. Wiring 13D is connected electrically to both of an n-type semiconductor region 11n and the p-type semiconductor region 11p through the contact hole CNT. The wiring 14A is connected electrically to the wiring 13D through the contact hole CNT.

Figure 10:
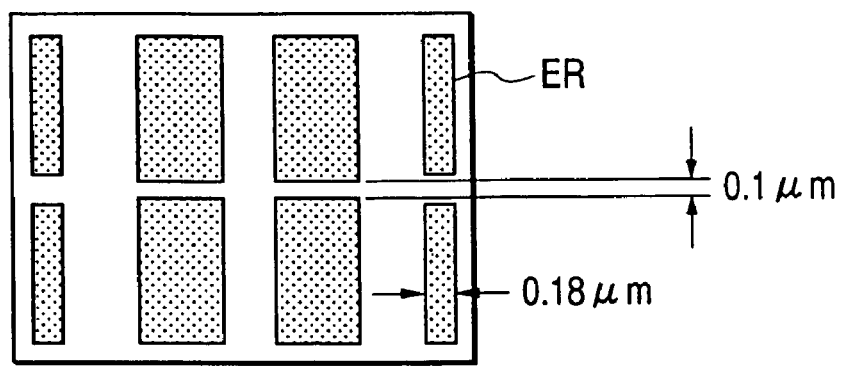
FIG. 10 is a top view of a major portion of pattern data used to form an isolation trench of the semiconductor integrated circuit device shown in FIG. 9.
Figure 11A:
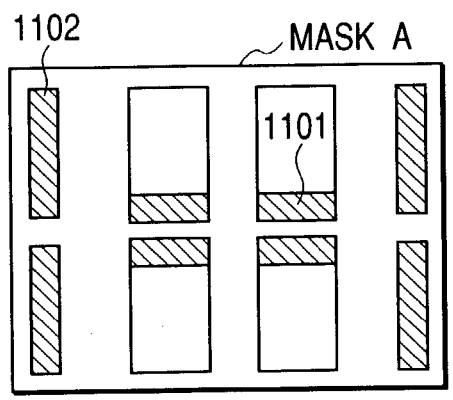
FIGS. 11A and 11B are top views of major portions of complementary masks used to divide the pattern data shown in FIG. 10.
Figure 11B:
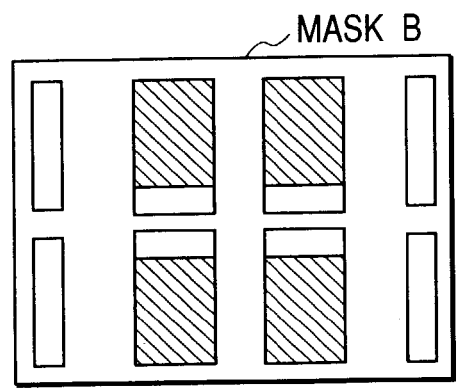

Next, a description will be made for the processes for forming an isolation trench and a gate layer according to the present invention. The processes are included in those for manufacturing the circuit shown in FIG. 9. At first, FIG. 10 shows mask data ER used for the isolation trench. In FIG. 10, there are patterns disposed adjacently with 0.1 μm spaces, as well as 0.18 μm wide aperture patterns. Then, 0.15 μm regions 1101 located at the edge of each aperture pattern adjacent to another at fine spaces as shown in FIGS. 11A and 11B, as well as aperture patterns 1102 under 0.18 μm are extracted from the mask data shown in FIG. 10 and put into the mask A while other patterns are put into the mask B.

Next, a process for forming the nMISQn and the pMISQp will be described with reference to the cross sectional view along the dotted line shown in FIG. 9, as well as FIGS. 12 and 13.

Figure 12A:
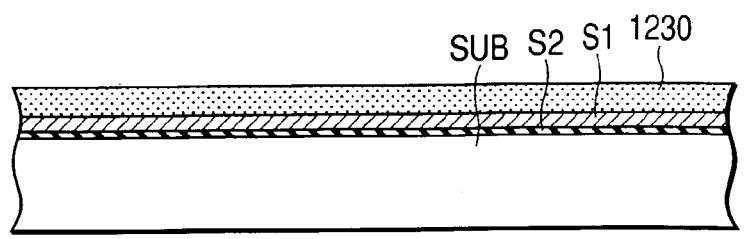
FIGS. 12A to 12F are cross sectional views of major portions of the semiconductor integrated circuit device shown in FIG. 9.
Figure 12B:
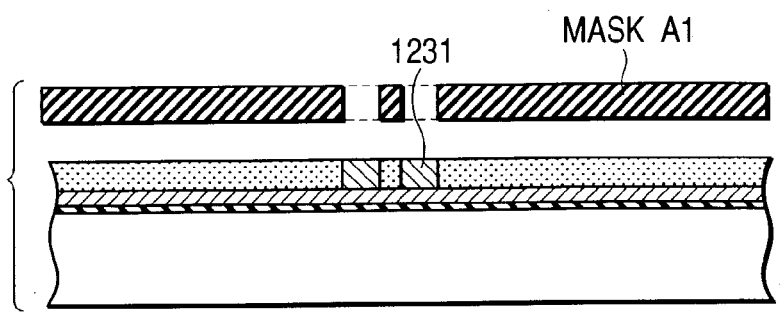
Figure 12C:
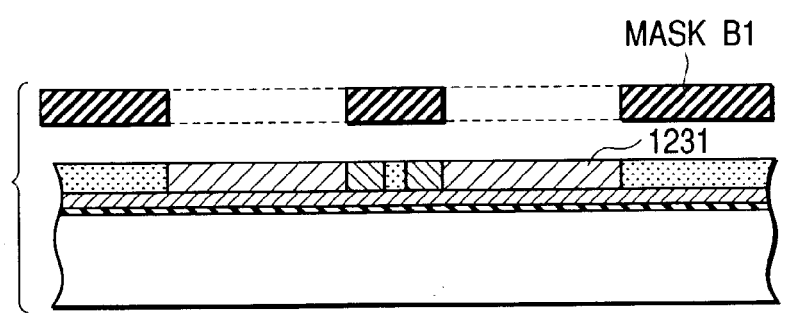
Figure 12D:
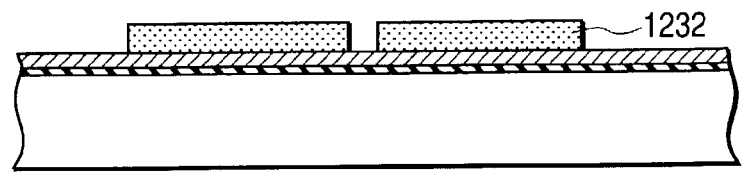
Figure 12E:
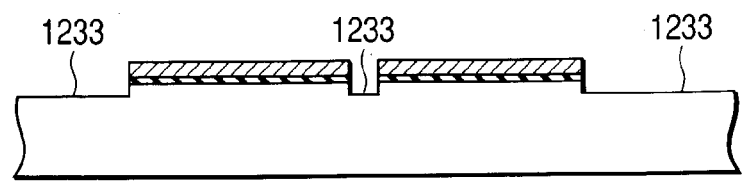
Figure 12F:
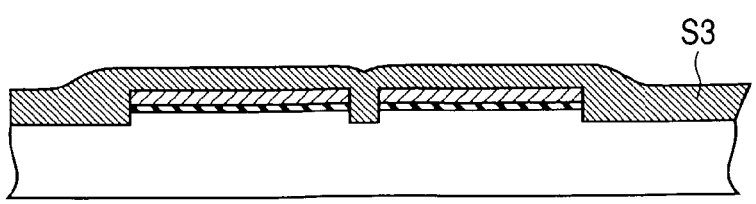

At first, an insulator film S2 is formed with, for example, a silicon oxide film on the main surface (device surface) of the semiconductor substrate SUB on which a wafer constituted by p-type silicon single crystal with use of the oxidation method. Then, on the insulator film S2 is deposited an insulator film S1 made of, for example, silicon nitride film with use of the CVD (Chemical Vapor Deposition) method or the like, then a resist film 1230 is coated thereon (FIG. 12A). The resist used here is chemically amplified negative-type resist. After this, the mask A1, which is a complementary mask used for electron beam projection is used to print patterns on the resist film 1230 to form latent images 1231 in the electron beam resist (FIG. 12B). Similarly, the complementary mask B1 is used for printing patterns to form latent images 1231 (FIG. 12C). After this, the object is passed to a heating process to remove regions except for the latent images in the resist film with use of alkaline developer, then subjected to a development process to form a resist pattern 1232 on the main surface of the semiconductor substrate SUB (FIG. 12D). The resist pattern is formed flatly so that the isolation trench region is exposed and the active region is covered. After this, the resist pattern 1232 is used as an etching mask to remove the insulator films S1 and S2 to be exposed sequentially and further remove the main surface of the semiconductor substrate SUB to form a trench 1233 in the main surface of the semiconductor substrate SUB. Then, the resist pattern 1232 is removed (FIG. 12E). Then, an insulator film S3 made of, for example, silicon oxide film is deposited on the main surface of the semiconductor substrate SUB by means of the CVD method or the like (FIG. 12F), then the semiconductor substrate SUB is smoothed by means of, for example, the CMP (Chemical Mechanical Polishing) method or the like to finally form, for example, an isolation trench block SG (FIG. 13A) In this embodiment, the isolation trench block is formed as a trench isolation structure, but the embodiment is not limited only to that; for example, the isolation trench may be a subfield insulator film formed by means of the LOCOS (Local Oxidation of Silicon) method.

Figure 13A:
FIGS. 13A to 13F are top views of major portions of the semiconductor integrated circuit device shown in FIG. 9, which are continued from those shown in FIGS. 12A to 12F, in manufacturing processes.
Figure 13B:
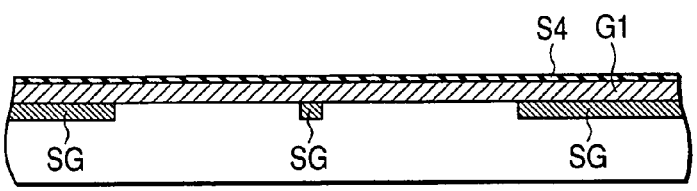
Figure 13C:
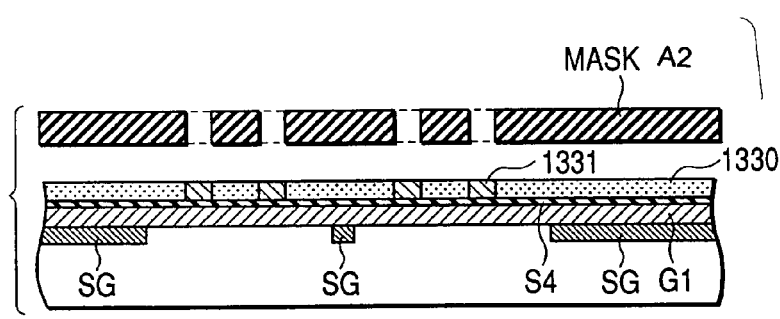
Figure 13D:
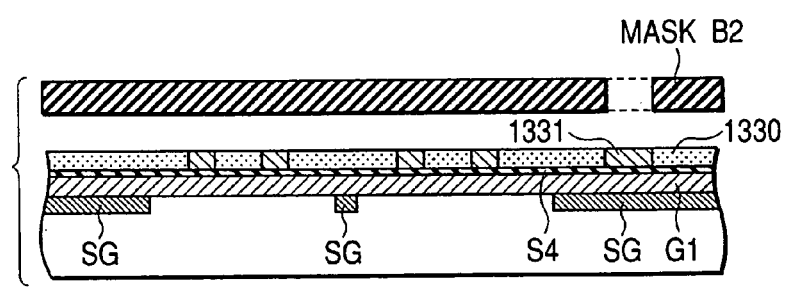
Figure 13E:
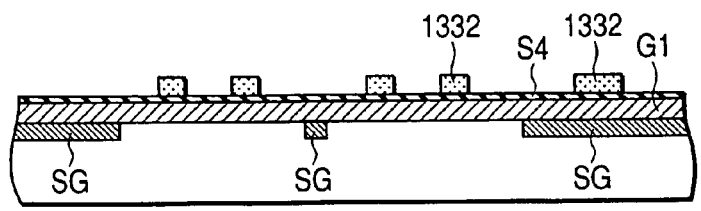

Furthermore, after the gate oxide film is formed, such a gate electrode material G1 as polycrystalline silicon film and such an insulator film S4 as an $SiO_2$ film or the like are deposited by about 100 nm respectively (FIG. 13B) by means of the CVD (Chemical Vapor Deposition) method, then a negative-type electron beam resist is coated thereon and the mask A2 that includes the gate patterns on the active region is exposed (FIG. 13C). The mask A2 is one of the complementary masks obtained by the data division by means of the method employed in the first embodiment. Then, the latent images 1331 are formed by multiple printing with use of the mask B2 (FIG. 13D).

Figure 13F:
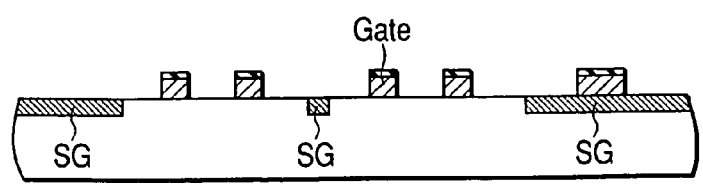

Furthermore, the object is passed to thermal treating and developing processes similarly to those for forming the isolation trench pattern so as to form a resist pattern (FIG. 13E) After this, the insulator film S4 and the gate electrode material G1 are etched to form the gate pattern Gate (FIG. 13F).

Hereinafter, the above pattern printing method or conventional pattern printing method may be used for the subsequent processes. Other processes except for the lithography one may also be carried out as conventionally.

This completes the manufacturing of nMISQn and pMISQp.

While a description has been made for a method to manufacture semiconductor devices, the method is not limited only for manufacturing semiconductor devices; for example, the method may also apply to liquid crystal displays, etc. if an energy beam is irradiated on the object to print patterns on a energy beam-sensitive substrate.

(Seventh Embodiment)

In this seventh embodiment, a description will be made for a method to dispose each subfield obtained by complementary division on a real mask concretely.

FIG. 20A shows a chip constituted by 6×5 subfields. Reference numerals 1—1, 1-2, . . . 6-5 denote subfields. Patterns on this chip are divided complementarily by means of the same method as that in the third embodiment so that the mask A includes subfields including only fine patterns and having low aperture ratios while the mask B includes subfields including patterns other than the fine patterns and having comparatively high aperture ratios. FIGS. 20B-1 and 20B-2 show the result. The subfield 1—1 is divided into subfields A1-1 and B1-1, then the subfields A1-1 and B1-1 are projected and exposed multiply almost on the same position on the wafer to form the pattern of the subfield 1—1.

One of the method for disposing those subfields on a real mask is to form a region for the subfields put into the mask A collectively and another region for disposing the subfields put into the mask B collectively on the real mask. In this case, however, the subfields in the mask A have low aperture ratios, so that the distribution of the aperture ratios in the whole real mask is one-sided, thereby the mask is distorted.

Figure 22:
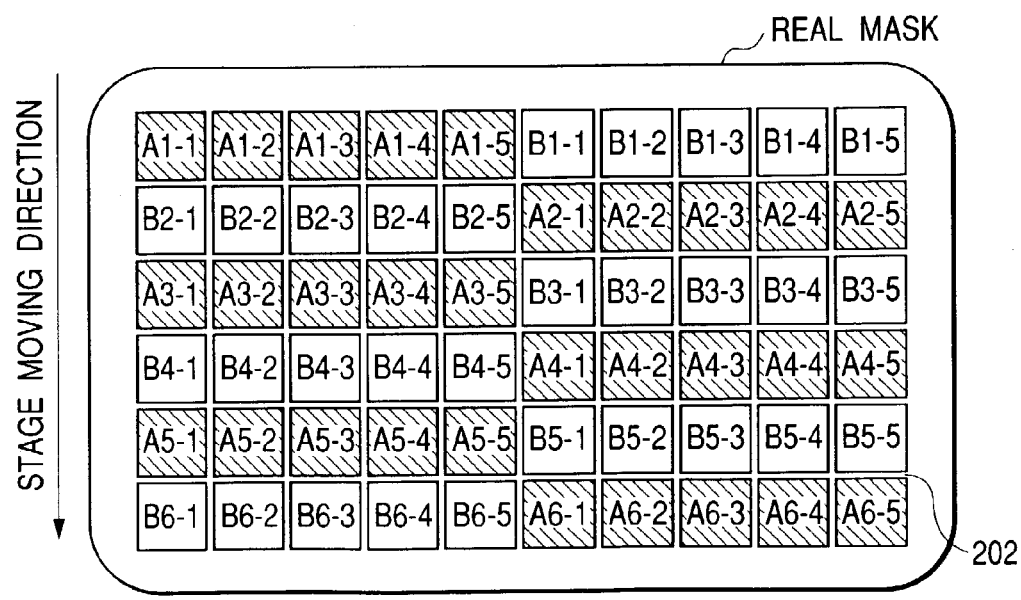
FIG. 22 is another top view of subfields disposed after the completion of complementary division on a real mask.

As shown in FIG. 22, the subfields in the mask A and the subfields in the mask B are disposed alternately, thereby suppressing the distortion of the real mask.

Figure 23:
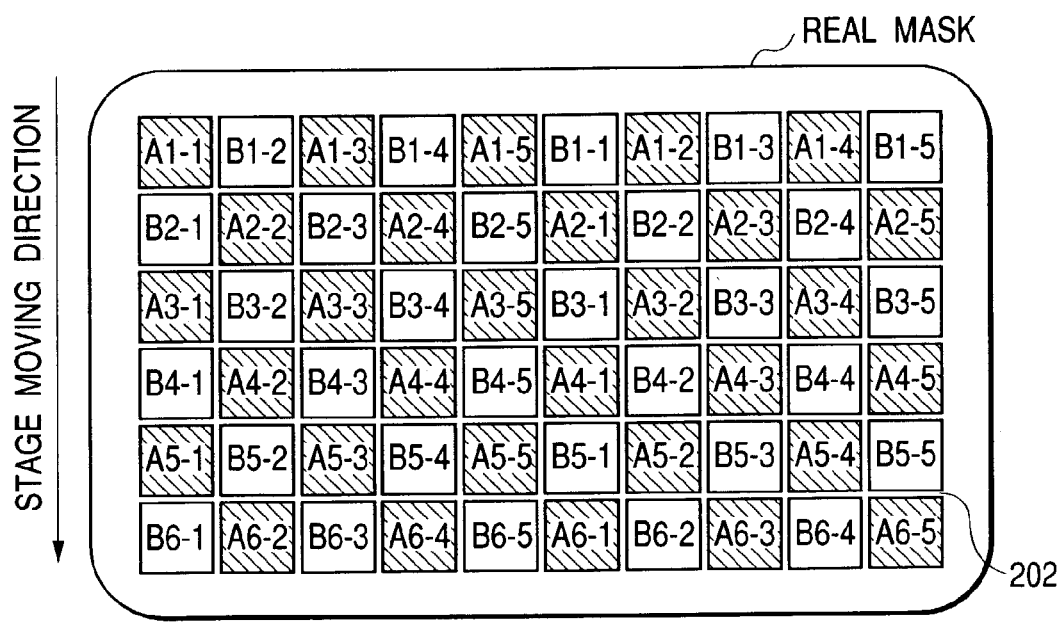
FIG. 23 is still another top view of subfields disposed after the completion of complementary division on a real mask.

In addition, if the subfields in both masks A and B are disposed like a dice pattern as shown in FIG. 23, the distribution of aperture ratios can be equalized on the whole real mask.

Figure 21:
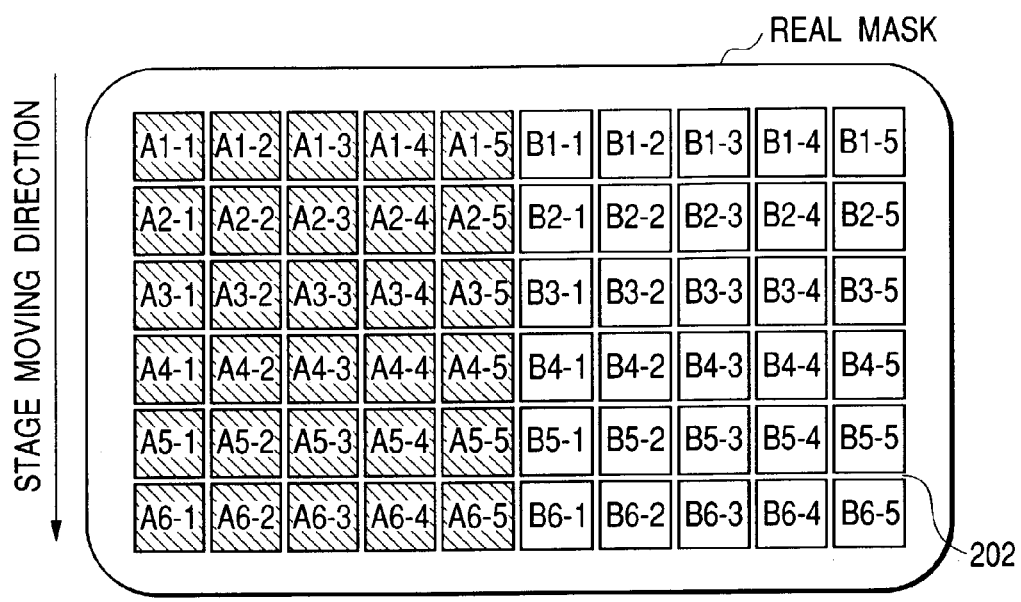
FIG. 21 is a top view of subfields disposed after the completion of the complementary division on a real mask.

Any mask shown in FIGS. 21 through 23 can be used to print patterns on the same conditions as those for stage moving and deflecting directions, etc.

(Eighth Embodiment)

Figure 24:
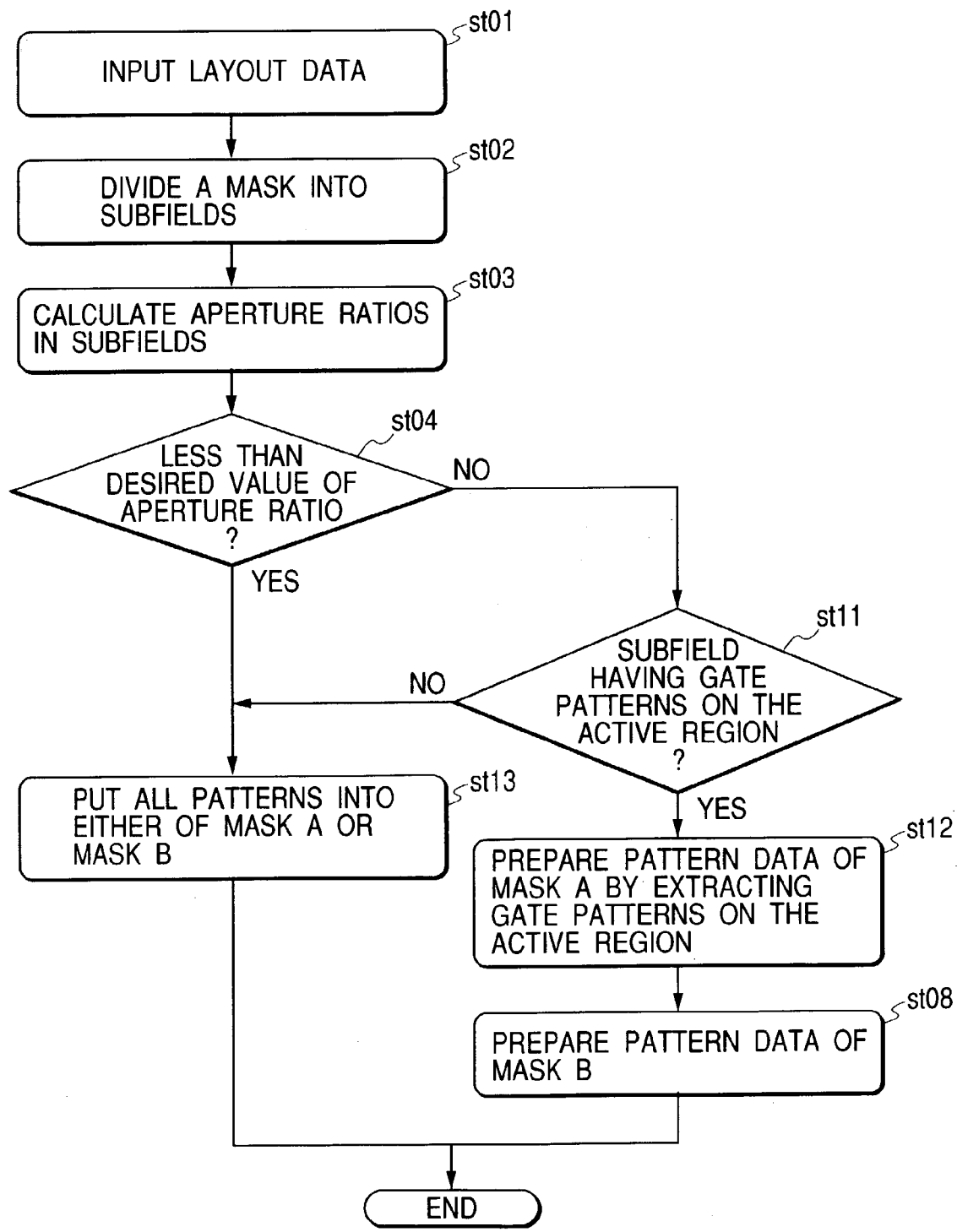
FIG. 24 is a flowchart of complementary division of gate pattern data according to the present invention.

In this embodiment, a description will be made for complementary division of a gate layer according to the aperture ratio of each subfield with reference to a flowchart shown in FIG. 24. The printing device used here increases the beam blur in a subfield when the aperture ratio becomes 15% or more, thereby it is disabled to form the gate pattern on the active region accurately. However, there is no problem to arise from forming patterns on any regions other than the active ones even when the aperture ratio is 15% or more, since the required dimension accuracy for those patterns is low.

At first, layout data is inputted (st01) and the surface of the chip is divided into subfields (st02). Then, the aperture ratio of each subfield is calculated (st03) and it is checked if the aperture ratio is under a predetermined value (st04). If the aperture ratio is under 15%, all the patterns are put into the mask A or B (st13) to save the complementary division time, since the gate patterns on the active regions are also formed accurately.

If the aperture ratio in each subfield is 15% or more, it is checked if the subfield includes a gate pattern on the active region (st11). If the subfield includes a gate pattern on the active region, all the gate patterns are extracted from the active regions and pattern data of the mask A is prepared (st12) and other patterns are put into the mask B (st08).

On the other hand, if the subfield includes no gate pattern while it has an aperture ratio of 15% or more, all the patterns are put into the mask A or B without doing complementary division (st13).

As described above, only the necessary minimum complementary division time is required to reduce the aperture ratio in each subfield under 15% even when the subfield includes a gate pattern on the active region, which requires high dimension accuracy.

According to the embodiments of the present invention, therefore, patterns requiring high dimension accuracy can be formed at a high throughput by disposing those patterns in one mask and other patterns in the other mask. The two masks are obtained by complementary division of an original mask in an electron beam projection process.

What is claimed is:

1. A method for manufacturing a semiconductor device by forming a desired pattern by means of an electron beam irradiated on an electron beam sensitive composition film formed on a substrate of said device through a mask, wherein:

said desired pattern includes a first pattern requiring first printing accuracy and a second pattern requiring second printing accuracy that is lower than said first printing accuracy;

a first mask for printing said first pattern and a second mask for printing said second pattern having a larger aperture ratio than that of said first mask are provided; and projection regions of said first mask and said second mask are put one upon the other, thereby said electron beam is irradiated on said film through said first and second masks.

2. A method for manufacturing a semiconductor device by forming a desired pattern by means of an electron beam irradiated on an electron beam sensitive composition film formed on a substrate of said device through a mask, wherein:

said desired pattern is divided into a plurality of subfields in a predetermined size;

said mask is divided into a first block mask for printing a first pattern requiring a first printing accuracy and a second block mask having a larger aperture ratio than that of said first block mask for printing a second pattern requiring second printing accuracy that is lower than said first printing accuracy, so that said first and second block masks are used for said desired pattern in each of said subfields if an area rate between an electron beam irradiation block and an electron beam non-irradiation block in each of said subfields on said substrate exceeds a predetermined value; and projection regions of said first block mask and said second block mask are put one upon the other, thereby said electron beam is irradiated on said film through said first and second masks.

3. A method for manufacturing a semiconductor device by forming a desired pattern by means of an electron beam irradiated on an electron beam sensitive composition film formed on a substrate of said device through a mask, wherein:

said desired pattern is divided into a plurality of subfields in a predetermined size;

said mask is divided into a first block mask for printing a first pattern requiring a first printing accuracy and a second block mask for printing a second pattern requiring second printing accuracy that is lower than said first printing accuracy, so that said first and second block masks are used for said desired pattern in each of said subfields if an area rate between an electron beam irradiation block and an electron beam non-irradiation block in each of said subfields on said substrate exceeds a predetermined value; and projection regions of said first block mask and said second block mask are put one upon the other, thereby said electron beam is irradiated on said film through said first and second masks, and wherein:

said desired pattern in each of said subfields is further divided into a plurality of block fields that are smaller in dimension than said subfields; and projection regions of said first block mask and said second block mask are put one upon the other, thereby said electron beam is irradiated on said film through said first and second masks for said desired pattern in each of said subfields when an area rate between an electron beam irradiation block and an electron beam non-irradiation block in each of said smaller block fields on said substrate exceeds a predetermined value.

4. The method according to claim 1, wherein:

currents to be irradiated to said first and second masks are the same.

5. A method for manufacturing a semiconductor device by forming a desired pattern that includes a gate pattern formed on an active layer by means of an electron beam irradiated on a electron beam sensitive composition film formed on a substrate of said device through a mask, wherein:

said desired pattern is formed on said active layer and constituted by a first pattern that includes a gate pattern requiring first printing accuracy and a second pattern that includes a pattern other than said gate pattern, which requires second printing accuracy that is lower than said first printing accuracy;

said mask is divided into a first mask for printing said first pattern and a second mask having a larger aperture ratio than that of said first mask for printing said second pattern; and projection regions of said first mask and said second mask are put one upon the other, thereby said electron beam is irradiated on said film through said first and second masks.

6. The method according to claim 5, wherein:

said first pattern is an overlapped portion of a pattern connected electrically to said gate pattern and said active layer pattern or a graphic form obtained by expanding said gate pattern in the longitudinal direction of said gate pattern by a predetermined distance.

7. A method for manufacturing a semiconductor device by forming a desired pattern by means of an electron beam irradiated on an electron beam sensitive composition film formed on a substrate of said device through a mask, wherein:

said desired pattern is divided into a plurality of subfields in a predetermined size;

said desired pattern in each of said plurality of subfields includes a first pattern requiring first printing accuracy and a second pattern requiring second printing accuracy that is lower than said first printing accuracy;

said mask is divided into a first block mask for printing said first pattern and a second block mask having a larger aperture ratio than that of said first block mask for printing said second pattern; and said method uses said mask formed by arranging side by side a first mask including the first block masks disposed in a matrix pattern and a second mask including the second block masks disposed in a matrix pattern, in accordance with a predetermined rule.

8. A method for manufacturing a semiconductor device by forming a desired pattern by means of an electron beam irradiated on an electron beam sensitive composition film formed on a substrate of said device through a mask, wherein:

said desired pattern is divided into a plurality of subfields in a predetermined size;

said desired pattern in each of said plurality of subfields includes a first pattern requiring first printing accuracy and a second pattern requiring second printing accuracy that is lower than said first printing accuracy;

said mask is divided into a first block mask for printing said first pattern and a second block mask for printing said second pattern; and said method uses said mask formed by arranging side by side a first mask including the first block masks disposed in a matrix pattern and a second mask including the second block masks disposed in a matrix pattern, in accordance with a predetermined rule, and wherein:

said predetermined rule specifies forming of a third mask and a fourth mask;

said third mask is formed by repeating disposing a group of second block masks disposed on the first row of said second mask at the lower end of a group of first block masks disposed on the first row of said first mask, thereby disposing the group of said second block masks at the lower end of the group of said first block masks sequentially, beginning on the first row; and said fourth mask is formed by repeating disposing a group of first block masks disposed on the first row of said first mask at the lower end of the group of said second block masks disposed on the first row of said second mask, thereby the group of said first block masks is disposed at the lower end of the group of said second block masks sequentially, beginning at the first row; and said third and fourth masks are disposed side by side.

9. A method for manufacturing a semiconductor device by forming a desired pattern by means of an electron beam irradiated on an electron beam sensitive composition film formed on a substrate of said device through a mask, wherein:

said desired pattern is divided into a plurality of subfields in a predetermined size;

said desired pattern in each of said plurality of subfields includes a first pattern requiring first printing accuracy and a second pattern requiring second printing accuracy that is lower than said first printing accuracy;

said mask is divided into a first block mask for printing said first pattern and a second block mask for printing said second pattern; and said method uses said mask formed by arranging side by side a first mask including the first block masks disposed in a matrix pattern and a second mask including the second block masks disposed in a matrix pattern, in accordance with a predetermined rule, and wherein:

said predetermined rule specifies that an address for denoting a position of each of said plurality of sub fields as (i, j) (both i and j denote the i-th row from the top end of said first mask and the j-th column from the left end of said second mask, wherein $1 \leq i$ and $j \leq n$ is assumed);

a third mask and a fourth mask are prepared;

said third mask is formed by repeating disposition and replacement of sub fields so that, when i denotes an even number in the i-th row of said first mask, the subfield having the (i-j) address of said first mask is disposed in an address of j=odd number and the subfield in an address of j=even number is replaced with the subfield having the (i-j) address of said second mask, then when i denotes an even number, the subfield having the (i-j) address of said first mask is disposed in an address of j=even number and the subfield in an address of j=odd number is replaced with the subfield having the (i-j) address of said second mask;

said fourth mask is formed by repeating disposition and replacement of subfields so that, when the i denotes an odd number in the i-th row of said second mask, the subfield having the (i-j) address of said second mask is disposed in an address of j odd number and the subfield in an address of j=even number is replaced with the subfield having the (i-j) address of said first mask, then, when i denotes an even number, the subfield having the (i-j) address of the second mask is disposed in an address of j=even number and the subfield in an address of j=odd number is replaced with the subfield having the (i-j) address of said first mask; and said third mask and said fourth mask are disposed side by side.

10. A semiconductor device manufactured by a method that includes a process of printing a desired pattern by means of an electron beam irradiated on an electron beam sensitive composition film formed on a substrate of said device through a mask, wherein:

said desired pattern includes a first pattern requiring first printing accuracy and a second pattern requiring second printing accuracy that is lower than said first printing accuracy;

said pattern is provided with a first mask for printing said first pattern (group) and a second mask having a larger aperture ratio than that of said first mask for printing said second pattern (group); and wherein the projection regions of said first mask and said second mask are put one upon another on the substrate, thereby said electron beam is irradiated on said film through said first and second masks.

11. A method for manufacturing a semiconductor device by forming a line-shaped pattern by means of an electron beam irradiated on a photo-sensitive electron beam composition film formed above a substrate provided with an active layer and an insulation film for device isolation formed around the active layer through a stencil mask, wherein:

the line-shaped pattern has a specific width and is the pattern to be formed in extending from a portion above the active layer to a portion above the insulation film for device isolation, and by forming the line-shaped pattern on the substrate by means of a first mask where a line-shaped pattern to be formed above the active layer requiring a high printing accuracy is formed, and by means of a second mask where a line-shaped pattern to be formed above the insulation film for a device not requiring a high printing accuracy is formed.

* * * * *